United States Patent
Yamazaki et al.

(10) Patent No.: US 7,091,698 B2
(45) Date of Patent: Aug. 15, 2006

(54) BATTERY CAPACITY CALCULATING METHOD

(75) Inventors: Kazuo Yamazaki, Kanagawa (JP); Tsuyonobu Hatazawa, Tokyo (JP); Takashi Tomita, Kanagawa (JP); Tamon Ikeda, Tokyo (JP); Ryuichi Nawa, Saitama (JP); Yuuichi Ishikawa, Osaka (JP); Masanori Hori, Osaka (JP)

(73) Assignee: Sony Corporation, Tokyo (JP)

( * ) Notice: Subject to any disclaimer, the term of this patent is extended or adjusted under 35 U.S.C. 154(b) by 273 days.

(21) Appl. No.: 10/483,795

(22) PCT Filed: Apr. 30, 2003

(86) PCT No.: PCT/JP03/05544

§ 371 (c)(1),
(2), (4) Date: Jan. 14, 2004

(87) PCT Pub. No.: WO03/096040

PCT Pub. Date: Nov. 20, 2003

(65) Prior Publication Data

US 2004/0160224 A1 Aug. 19, 2004

(30) Foreign Application Priority Data

May 14, 2002 (JP) ............................ 2002-139167

(51) Int. Cl.
*H02J 7/00* (2006.01)
(52) U.S. Cl. .................................................. 320/132
(58) Field of Classification Search ................ 320/132; 324/425, 426, 430
See application file for complete search history.

(56) References Cited

U.S. PATENT DOCUMENTS 6,262,577 B1 * 7/2001 Nakao et al. ................ 324/425
6,480,003 B1 * 11/2002 Ugaji et al. .................. 324/430
6,608,482 B1 * 8/2003 Sakai et al. .................. 324/426

FOREIGN PATENT DOCUMENTS

| JP | 10-104324 | 4/1998 |
|----|-----------|--------|
| JP | 2000-14019 | 1/2000 |
| JP | 2000-100478 | 4/2000 |
| JP | 2000-100479 | 4/2000 |
| JP | 2000-147075 | 5/2000 |
| JP | 2000-26190 | 9/2000 |
| JP | 2000-298160 | 10/2000 |
| JP | 2001-6756 | 1/2001 |
| JP | 2002-189066 | 7/2002 |

* cited by examiner

*Primary Examiner*—Pia Tibbits
(74) *Attorney, Agent, or Firm*—Sonnenschein Nath & Rosenthal LLP

(57) ABSTRACT

The present invention is relative to a battery capacity calculating method including a reference discharge curve calculating step of finding a discharge curve, operating as a reference, a corrected voltage calculating step of correcting a measured voltage V1 of the battery with a component of an electrical resistance to find a corrected voltage V, and a capacity calculating step of finding the discharging capacity of the battery from the discharge curve, operating as a reference, using the corrected voltage V. The capacity calculating step includes a sub-step of calculating a capacity deterioration index S, as a ratio of capacity decrease caused by battery deterioration. The discharging capacity, calculated from the discharging capacity, operating as a reference, using the corrected voltage V, is further multiplied with the capacity deterioration index S to calculate the discharging capacity.

6 Claims, 30 Drawing Sheets

BATTERY CAPACITY CALCULATING METHOD

BACKGROUND OF THE INVENTION

This invention relates to a battery capacity calculating method for calculating the discharging capacity or the residual capacity of a battery.

This application claims priority of Japanese Patent Application No. 2002-139167 filed in Japan on May 14, 2002, the entirety of which is incorporated by reference herein.

Additionally, the battery was deteriorated by a cyclic test of repeatedly carrying out the charging and discharging at 20° C. and discharging curves were measured of the battery at the 100th, 300th and 500th cycles to find the values of the discharging capacity.

The charging capacity at each current value, with the discharging capacity at each current value, with the 1 A discharging of 100%, is shown in the following Table 1. The discharging capacity ratio at each charging/discharge cycle is also shown in Table 1.

TABLE 1

| number of cycles | | 0.1 A | 0.2 A | 0.4 A | 0.8 A | 1.0 A | 2.0 A |
|---|---|---|---|---|---|---|---|
| 1 | discharging capacity Ahr | 1.7088 | 1.7073 | 1.7075 | 1.7049 | 1.7041 | 1.6885 |
|  | discharging capacity ratio % | 100.0 | 99.9 | 99.9 | 99.8 | 99.7 | 98.8 |
| 100 | discharging capacity Ahr | 1.5881 | 1.5803 | 1.5801 | 1.5766 | 1.5772 | 1.5621 |
|  | discharging capacity ratio % | 100.0 | 99.5 | 99.5 | 99.3 | 99.3 | 98.4 |
| 300 | discharging capacity Ahr | 1.4707 | 1.4528 | 1.4461 | 1.4373 | 1.4339 | 1.4072 |
|  | discharging capacity ratio % | 100.0 | 98.8 | 98.3 | 97.7 | 97.5 | 95.7 |
| 500 | discharging capacity Ahr | 1.1536 | 1.1075 | 1.1018 | 1.0887 | 1.0847 | 1.0421 |
|  | discharging capacity ratio % | 100.0 | 96.0 | 95.5 | 94.4 | 94.0 | 90.3 |

As the methods for calculating the capacity of a battery, for example, a lithium ion secondary battery, a method for calculating the residual capacity by a current integrating method of estimating the capacity from the value of Coulombs, and a method of calculating the residual capacity based on the voltage across battery terminals, have so far been used.

In calculating the battery capacity, there are produced variations in the value of the Coulomb or in the terminal voltage due to the difference in measurement conditions, or in the state of deterioration, even with the battery of the same type, so that it is extremely difficult to predict the current capacity or residual capacity of the battery with the above-described pre-existing capacity calculating method. This will be explained below by referring to experimental results.

A cylindrically-shaped lithium ion secondary battery, with a diameter of 18 mm and a length of 65 mm, was provided, and was electrically charged by a constant current constant voltage charging method, as a recommended charge method. That is, a constant current of 1 A is supplied to the battery and, when the voltage of 4.2V is reached, the charging state is switched to the constant voltage charge to maintain the voltage at 4.2 V for three hours. The nominal voltage of this battery under this charging condition is 1.7 Ah.

The battery of the initial state, fully charged by the above-described charging, was discharged to 2.5V, under the operating environment of the room temperature of 20° C. and the discharging current values of 0.1 A, 0.2 A, 0.4 A, 0.8 A, 1 A and 2 A and a discharge curve was measured to find the discharging capacity during this time interval. FIG. 30 shows a discharge curve of the battery of the initial state, that is during its initial charging/discharging cycle. It is noted that, for simplifying the explanation, the residual capacity, obtained on subtracting the discharging capacity, as found from the full charging capacity, is plotted on the abscissa.

As may be seen from the above Table 1, the discharging capacity is decreased with the increasing discharge current. This tendency is the more pronounced the severer the deteriorated state of the battery. Thus, even when the capacity of each fully charged battery is found, the Coulomb efficiency (discharging capacity/charging capacity) is changed with the discharging current, so that, with the method of calculating the residual capacity by the current integrating method of estimating the residual capacity from the Coulomb quantity, as the pre-existing residual capacity detection method, the difference between the estimated residual capacity and the actual residual capacity is increased to render it difficult to estimate the residual capacity to a high accuracy.

Moreover, as may be seen from FIG. 30, the discharge curve undergoes voltage decrease on the whole, with the increasing discharging current, and has plural voltages for a given residual capacity. Stated differently, the discharge curve is changed with the discharging conditions, so that, with the preexisting voltage method of simply measuring the discharge voltage to find the residual capacity based on a discharge curve operating as a reference, there is a fear that he estimated residual capacity is deviated significantly from the actual residual capacity.

SUMMARY OF THE INVENTION

It is an object of the present invention to provide a novel battery capacity calculating method whereby the problem inherent in the conventional battery capacity calculating method may be resolved.

It is another object of the present invention to provide a battery capacity calculating method whereby the residual capacity may be accurately calculated despite the deteriorated state of the battery or measurement conditions.

For accomplishing the above object, the present invention provides a method for measuring the capacity of a battery comprising a step of calculating a reference discharge curve for finding a discharge curve operating as a reference, a correction voltage calculating step of correcting a measured voltage V1 of the battery by a resistance component of the battery to find a corrected voltage V, and a capacity calculating step of calculating the discharging capacity of the battery from the discharge curve, operating as reference, using the corrected voltage V.

In distinction from a conventional method of calculating the residual capacity by directly using the actual measured voltage for a discharge curve, operating as a reference, the present invention corrects the measured voltage by a component of the electrical resistance, and uses the corrected voltage V, obtained by this correction, in the discharge curve, operating as a reference, to calculate the residual capacity. The use of the corrected voltage V cancels out the effect of the voltage derived from the component of the electrical resistance to suppress the error at the time of capacity calculations to a minimum.

The capacity calculating step includes a deterioration index calculating sub-step of calculating a capacity deterioration index S as a ratio of capacity decrease due to battery deterioration. Preferably, the capacity calculating step calculates the discharging capacity by multiplying a discharging capacity, calculated from the discharge curve, operating as a reference, using the corrected voltage V, with the capacity deterioration index S.

By calculating the battery discharging capacity from the discharge curve, operating as a reference, based on the corrected voltage V and the capacity deterioration index S, the effect ascribable to the deteriorated state of the battery may be canceled, for further decreasing the error as compared to the case of employing the corrected voltage V by itself.

Other objects and specific advantages of the present invention will become more apparent from reading the embodiments of the present invention in conjunction with the accompanying drawings.

DETAILED DESCRIPTION OF THE PRESENTLY PREFERRED EMBODIMENTS

Figure 1:
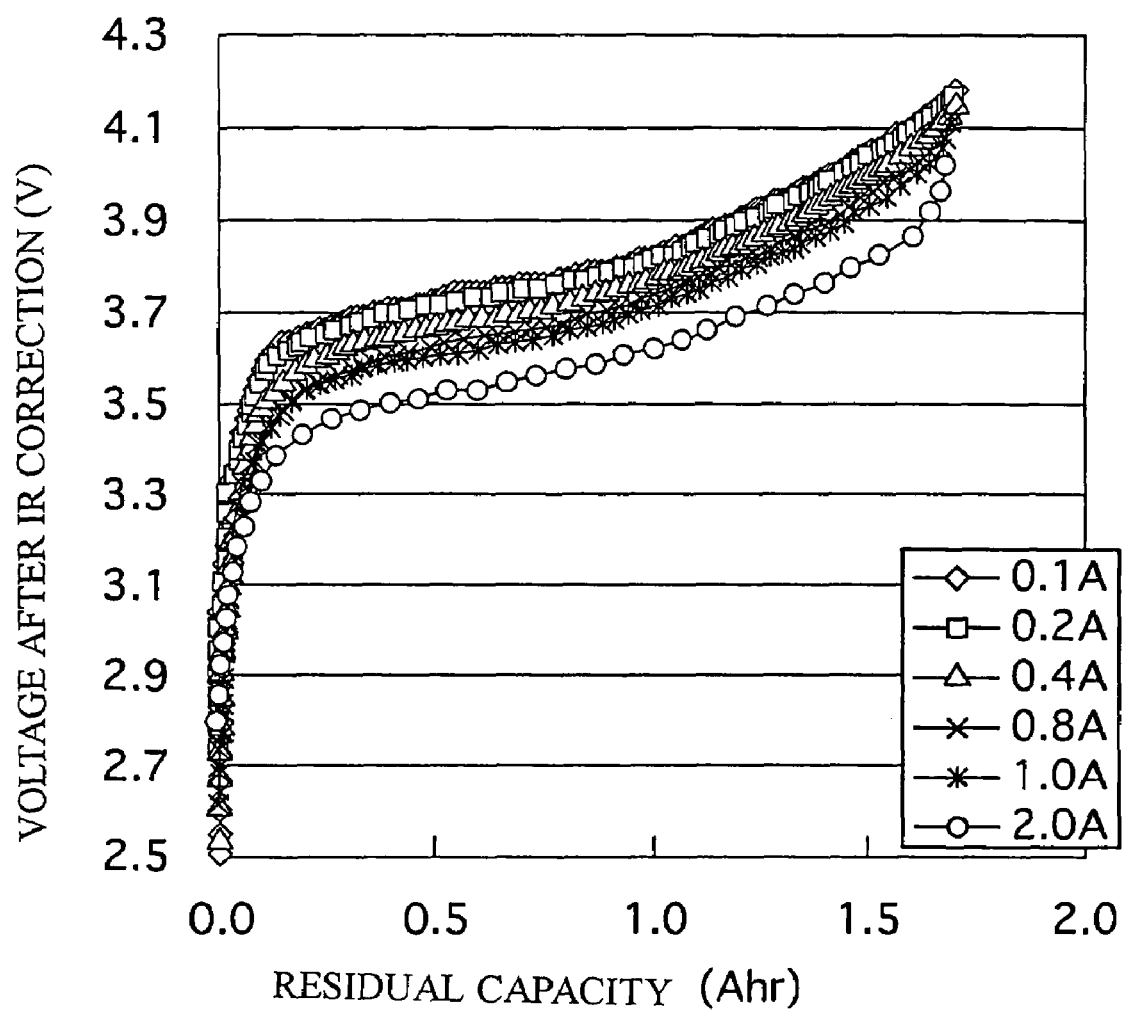
FIG. 1 depicts a discharge curve, re-calculated from a discharge curve shown in FIG. 30 with the use of a corrected voltage V, and specifically depicts a curve showing the case of using the equation (1) in finding the correction curve V, with R=0.15.

Referring to the drawings, a battery capacity measurement method according to the present invention is explained in detail.

The battery capacity measurement method according to the present invention schematically consists in finding a discharge curve operating as a reference (referred to below as a reference discharge curve) at the outset, then finding a corrected voltage V by correcting a measured voltage V1 of the battery, as a subject of measurement, with an electrical resistance component of the battery, to find the corrected voltage V, and by calculating the discharging capacity of the battery from the reference discharge curve using the so found corrected voltage V. The corrected voltage V causes the discharge curve of the battery, as the subject of measurement, to be approximated to the reference discharge curve.

In case the battery as the subject of measurement is deteriorated, further correction by multiplication by a capacity deterioration index S is carried out, in addition to the correction by the corrected voltage V, in order to calculate the discharging capacity from the reference discharge curve. This capacity deterioration index S will be explained later in detail. First, the capacity measurement method employing the corrected voltage V is explained on the basis of experimental results actually employing a battery.

Meanwhile, the battery means a cylindrically-shaped lithium ion secondary battery, with a customary diameter of 18 mm and a length of 65 mm, unless otherwise specified. The charging/discharging is carried out under an ambient temperature (20° C.). The charging is constant current constant voltage charging, as a recommended charging method, in which a constant current of 1 A is supplied to the battery until 4.2V is reached, at which time the charging mode is changed over to constant voltage charging to maintain the voltage of 4.2V for three hours. The nominal capacity of this battery under this charging condition is 1.7 Ah. Of course, the present invention is not limited to this type of the battery and may be applied to a wide variety of secondary batteries.

The electrical resistance component for correcting the measured voltage V1 of the battery may be exemplified by a voltage V2, derived from the internal resistance of the battery, a voltage V3 derived from a resistor and which depends on the current, and a voltage V4 derived from a resistor and which depends on the voltage. The corrected voltage V may be found by summing one or more of these voltages to the measured voltage V1. This may be shown by the following equation:

$$\text{corrected voltage } V = V1 + \Sigma Vn$$

where $n \geq 2$. In case the voltage is measured during charging, $V2 \leq 0$, $V3 \leq 0$ and $V4 \leq 0$. In case the voltage is measured during discharging, $V2 \geq 0$, $V3 \geq 0$ and $V4 \geq 0$.

In actually finding the corrected voltage V, an optimum electrical resistance component(s) need to be selected, depending on charging conditions, e.g. the temperature at the time of discharging or the discharge current, or on the precision of the correction as needed.

Figure 30:
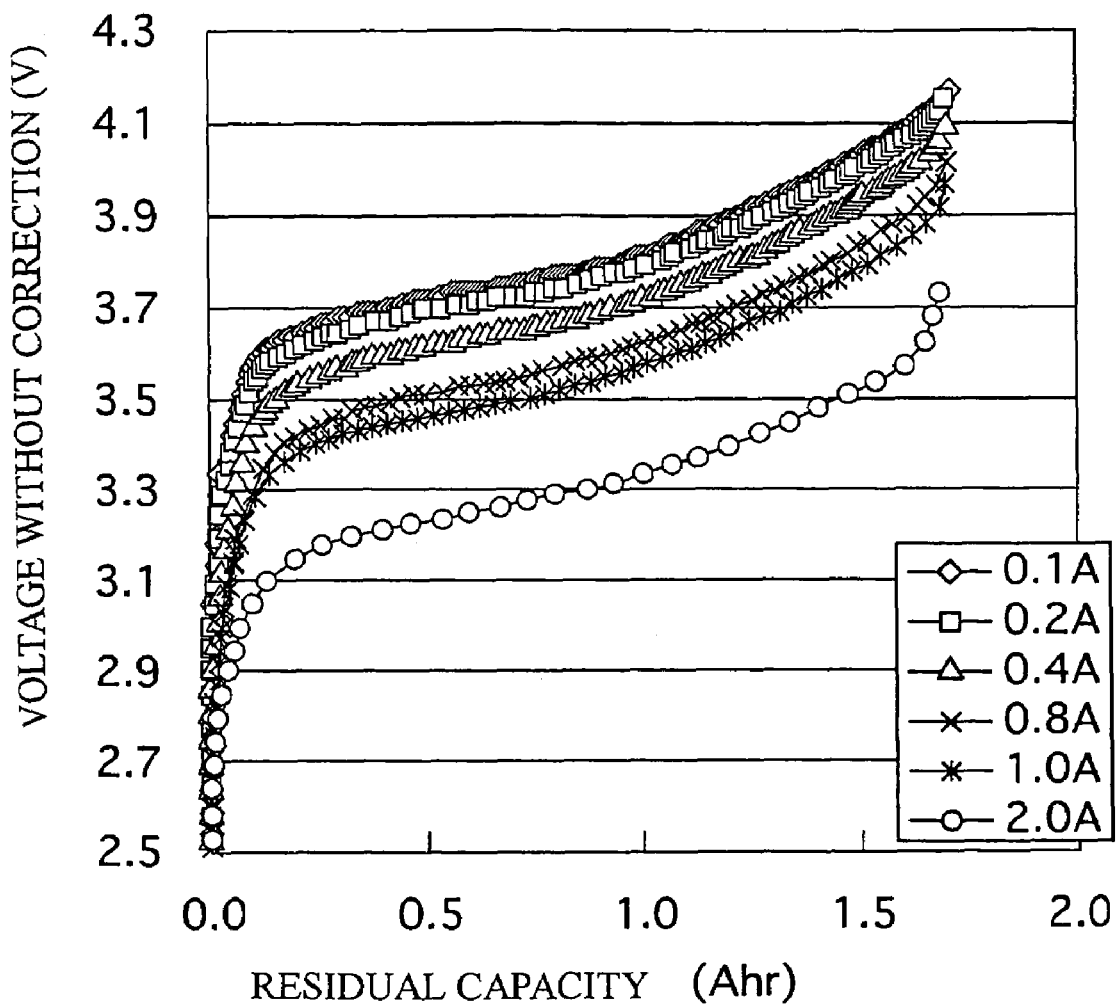
FIG. 30 is a graph showing the relationship between the measured voltage and the residual capacity of an initial state battery in case the battery is discharged at ambient temperature with the discharge current of 0.1 A, 0.2 A, 0.4 A, 0.8 A, 1 A and 2 A.

As a first method for calculating the correction voltage V, a method of correcting the measured voltage V1 of the battery of the initial state, exhibiting a discharge curve shown in FIG. 30, by the voltage V2 derived from the internal resistance, is first explained.

Taking into account the internal resistance R of the battery, not dependent on the current or voltage, the measured voltage V1 is corrected by the following equation (1), $$\text{corrected voltage } V = \text{measured voltage } V1 + IR \quad (1)$$

whereby the corrected voltage V is found. In the above equation (1), I denotes the discharge current, which is expressed hereinbelow by an absolute value.

Figure 2:
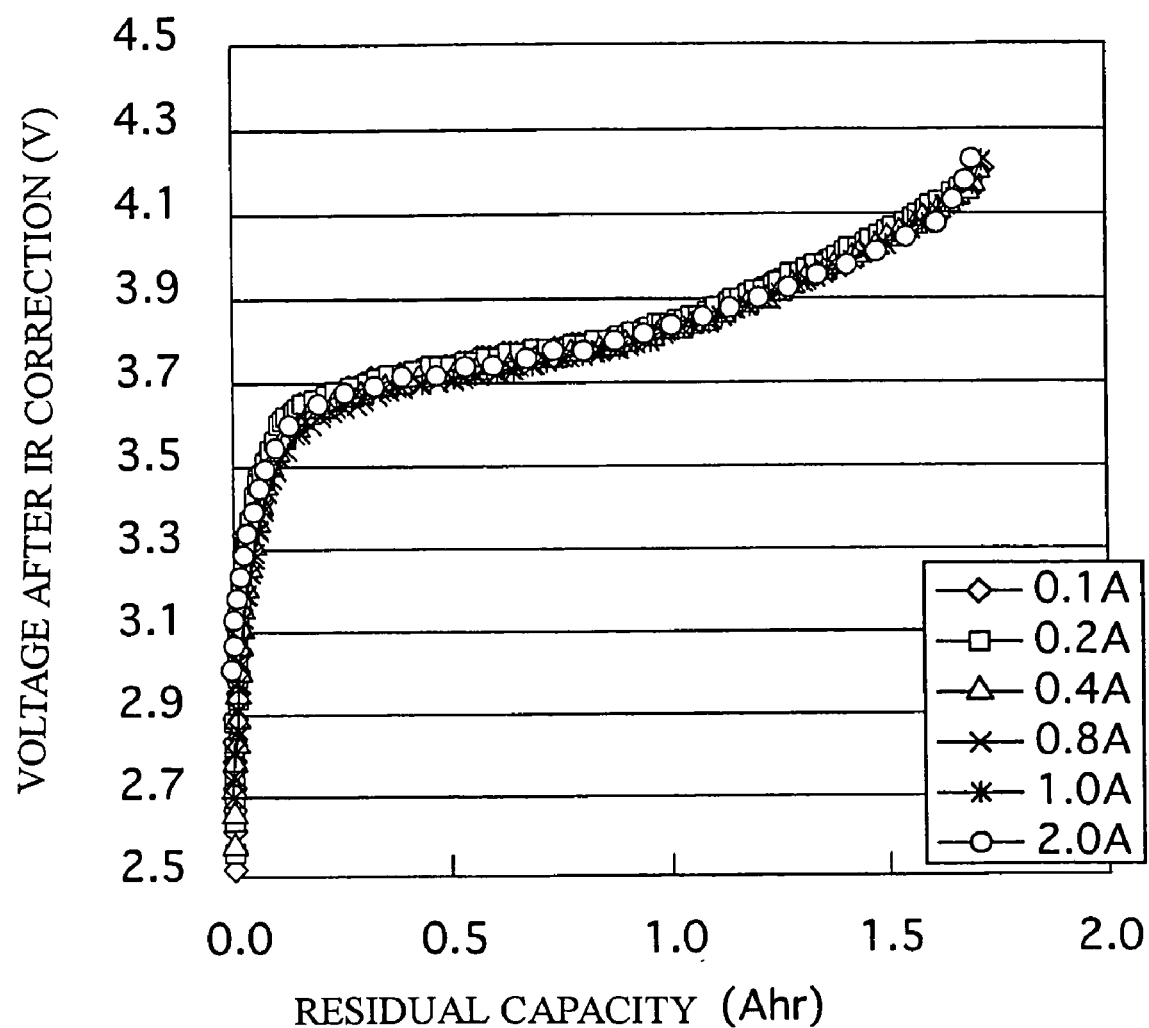
FIG. 2 depicts a discharge curve, re-calculated from a discharge curve shown in FIG. 30 with the use of a corrected voltage V, and specifically depicts a curve showing the case of using the equation (1) in finding the correction curve V, with R=0.25.

Using the corrected voltage V, as found, the discharge curves in case discharging was carried out at discharge current values of 0.1 A, 0.2 A, 0.4 A, 0.8 A, 1 A and 2 A, as shown in FIG. 30, were obtained by re-calculation, as shown in FIGS. 1 and 2. Meanwhile, R=0.15 and R=0.25 in FIGS. 1 and 2, respectively. The method for calculating the internal resistance R will be explained subsequently. In FIG. 1, in which the discharge curve was re-calculated with the internal resistance R of the battery of 0.15, the effect of voltage drop ascribable to the internal resistance R of the battery is diminished, with the discharge curve with a load larger than in the case of the discharge curve with the discharge current of 0.1 A approaching the discharge curve with the discharge current of 0.1 A. In FIG. 2, in which the discharge curve was re-calculated with the internal resistance R of the battery of 0.25, the effect of voltage drop ascribable to the internal resistance R of the battery is diminished further, with the discharge curve with a load larger than in the case of the discharge curve with the discharge current of 0.1 A substantially coinciding with the discharge curve with the discharge current of 0.1 A. That is, if the discharge curve for the discharge current of 0.1 A with a smaller load is the reference discharge curve, any optional discharge curve may be brought into coincidence with the reference discharge curve by the corrected voltage V.

Thus, if the battery as a subject of measurement is in the initial state, and the environment of using the battery is the ambient temperature on the order of 20° C., the capacity resulting from discharge at an optional given time point may be found using the corrected voltage V as found by the equation (1). Thus, the residual capacity may be estimated on subtraction of the discharging capacity thus found from the full charging capacity.

Figure 3:
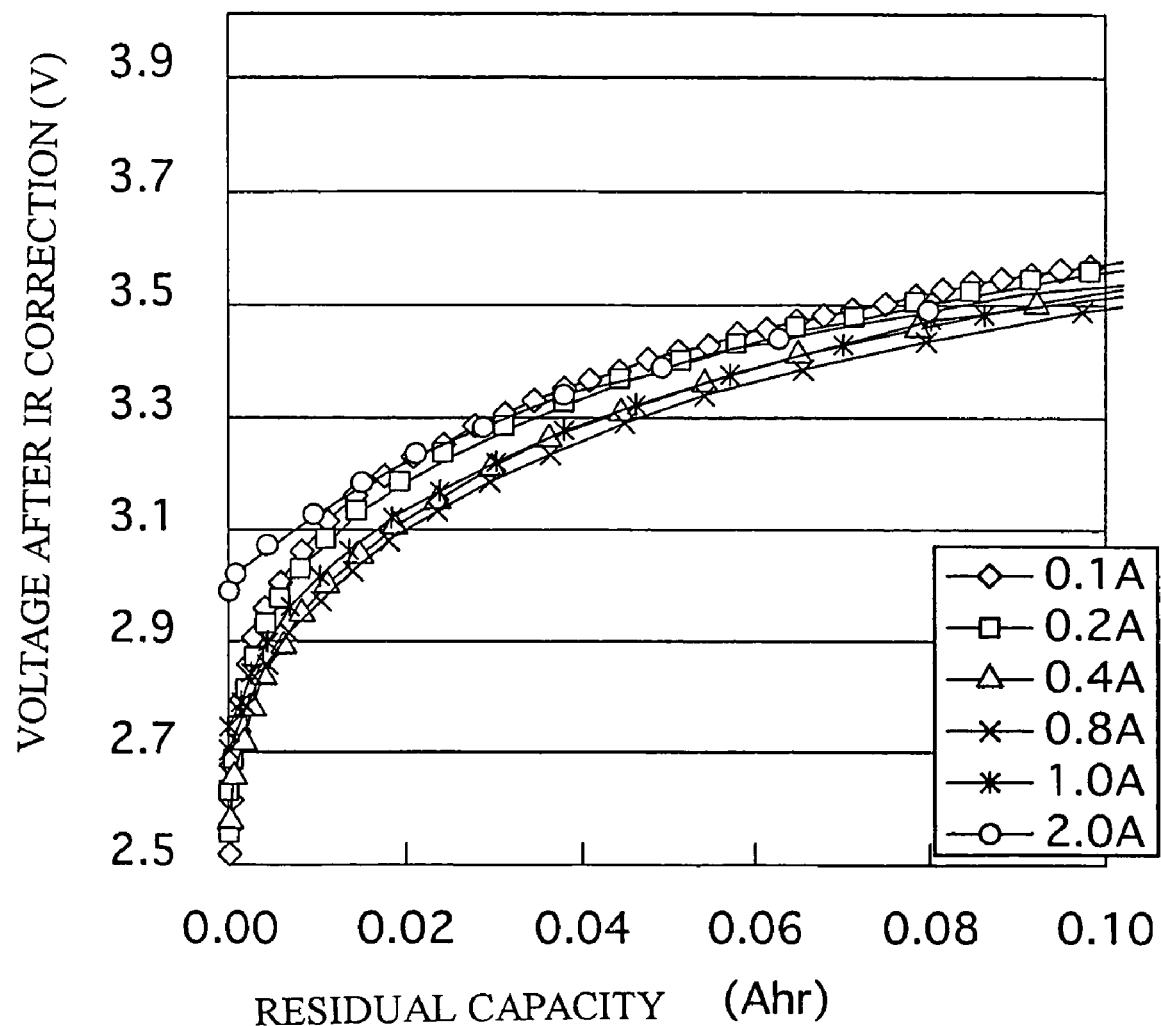
FIG. 3 shows, to an enlarged scale, an area for a period close to the discharge end period, shown in FIG. 2.

In FIG. 2, showing discharge curves re-calculated with R=0.25, an area for 3.5V to 2.5V, corresponding to the near-discharge-end period, is enlarged and the scale of the abscissa is extended, as shown in FIG. 3. Scrutiny of this figure indicates that, in the near-discharge-end period, the state of coincidence of the discharge curve for the discharge current of 0.1 A with a small load and other discharge curves is impaired. From this, it may be inferred that, with the correction of taking only the internal resistance R into account, as descried above, slight errors may be incurred in the estimation of the residual capacity in the near-discharge-end period.

As a second method for calculating the corrected voltage V, a method of correcting the measured voltage V1 by an overvoltage corresponding to a voltage derived from the internal resistance V2 and a voltage derived from a current-dependent resistance V3 is hereinafter explained.

Based on the Butler-Bolmer's theory, correlating the current and the over-voltage on the electrode interface, the overvoltage η is calculated in accordance with the following equation (2), $$\eta = 2.3RT/(\alpha nF) \cdot \log(I/0.1) \quad (2)$$

where α is a constant larger than 0, R is the ideal gas constant, T is the absolute temperature, F is the Faraday constant and I is the value of the discharge current, n being here equal to 1.

The following equation (3) is obtained on summing the term of the overvoltage η, thus found, to the above equation (1).

$$\text{corrected voltage } V = \text{measured voltage } V1 + IR + \eta \quad (3)$$

Figure 4:
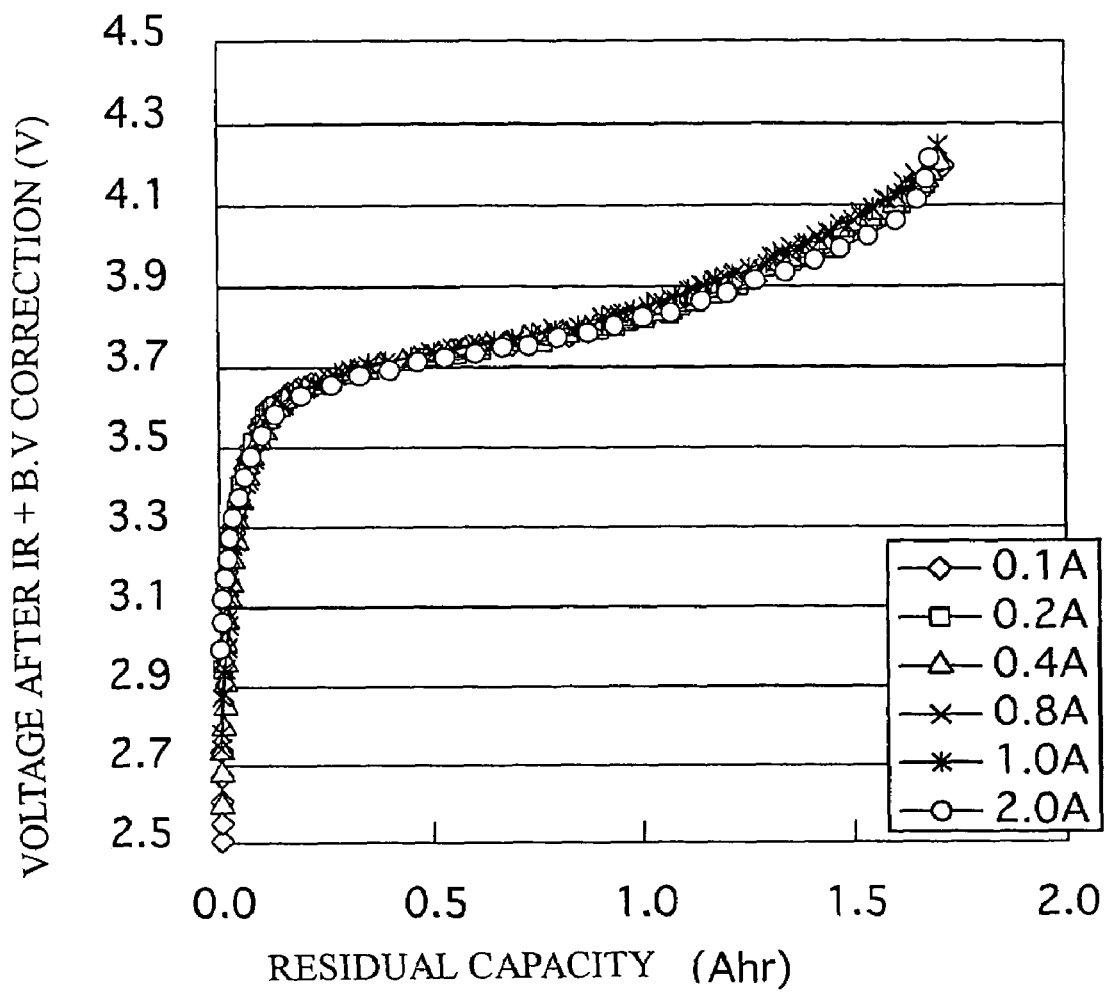
FIG. 4 depicts a discharge curve, re-calculated from a discharge curve shown in FIG. 30 with the use of a corrected voltage V, and specifically shows the case of using the equation (3) in finding the correction curve V.
Figure 5:
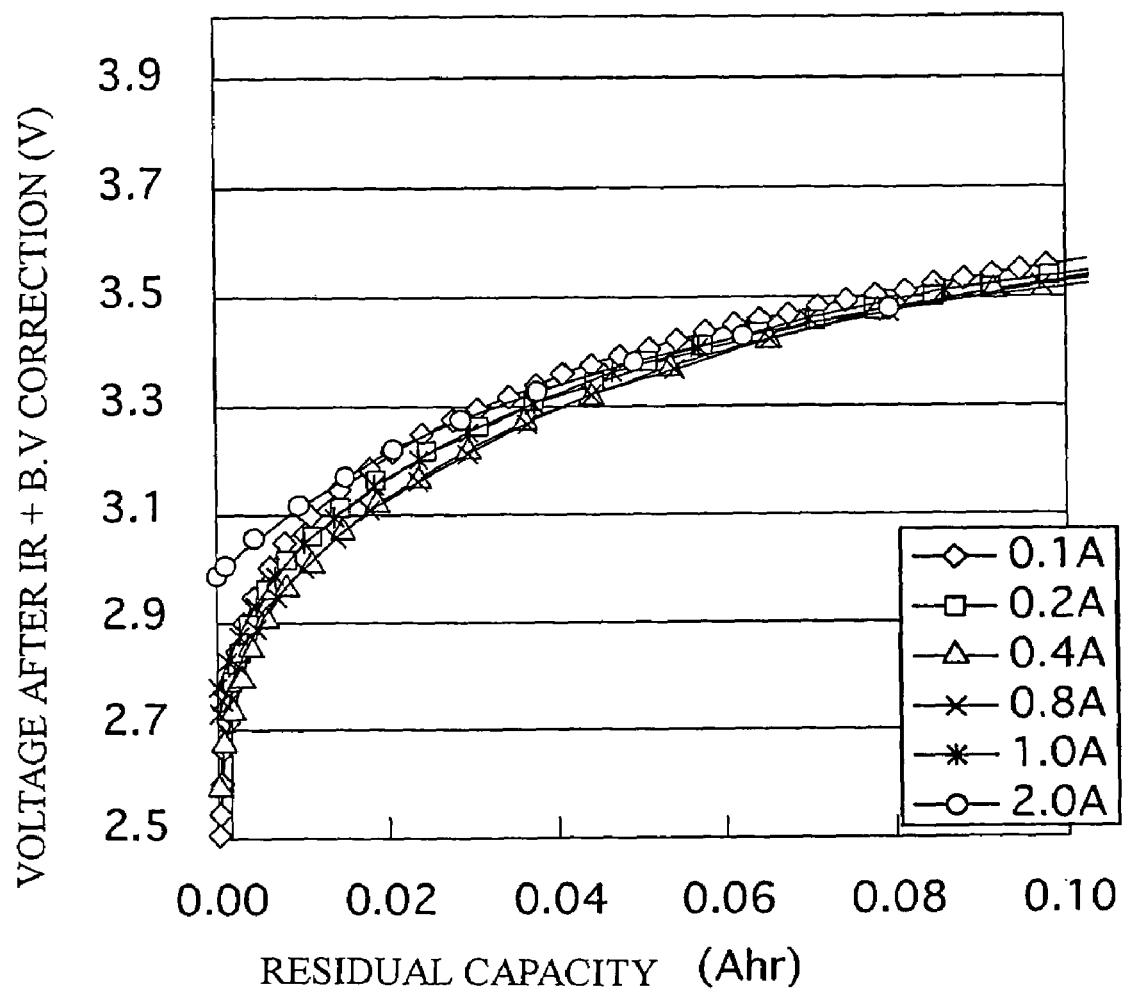
FIG. 5 shows, to an enlarged scale, an area for the period close to the discharge end period, shown in FIG. 4.

FIG. 4 shows the results of re-calculations of the respective discharge curves shown in FIG. 30, using the corrected voltage V as found from the equation (3), with the constant α and the internal resistance R in the equation (2) being set to 0.3 and to 0.15, respectively. In FIG. 4, an area for 3.5V to 2.5V, corresponding to the near-discharge-end period, is enlarged and the scale of the abscissa is extended, as shown in FIG. 5. Scrutiny of FIGS. 4 and 5, obtained on recalculations by the correction voltage V having introduced the overvoltage η, indicates that, especially in the near-discharge-end period, the state of coincidence with the discharge curve for the discharge current of 0.1 A has been improved as compared with the discharge curves of FIGS. 2 and 3, in which the overvoltage η has not been introduced. It may therefore be said that, by adding the term of the overvoltage η in finding the corrected voltage V, it becomes possible to estimate the residual capacity more accurately.

Moreover, by employing the term of the overvoltage η it is possible to obtain the internal resistance R closer to the measured value than with R=0.25, the discharge curves for which are indicated in FIG. 3. Moreover, in the case of actual equipment, such as a personal computer or a mobile phone, it is necessary to measure this internal resistance R during use of the battery in order to find the residual capacity, such that, if the resistance value of the internal resistance is appreciably different from the measured value, a marked error tends to be produced in estimating the capacity. In this respect, the residual capacity can be calculated more accurately in case the corrected voltage V is found using the equation (3) than in case the voltage is found using the equation (1).

It should be noted that the reference discharge curve, needed in calculating the battery capacity, may be based on measured values, obtained on actually discharging the battery, or based on theoretical values. The case in which a theoretical discharge curve, found from the difference between the open circuit potential function of the cathode and that of the anode of the battery, is to be the reference discharge curve, is now explained.

These open circuit potential functions may be obtained by expressing actually measured data in the form of functions. Specifically, the open circuit potential function of the cathode was found by charging the battery to 4.25 V, with the current density of 0.1 mA/cm$^2$, with the counter-electrode being a lithium metal electrode. The open circuit potential function of the anode was found by discharging the battery to 0.05 V, with the current density of 0.1 mA/cm$^2$, followed by maintaining the voltage not higher than 0.05 V for 25 hours, with the counter-electrode being a lithium metal electrode. The theoretical reference discharge curve was then found, based on the difference between the open circuit potential function of the cathode and that of the anode, as measured, and this theoretical reference discharge curve (voltage minus the residual capacity) was represented by a polynominal of an exponential function as shown in the following equation (4), $$\text{residual capacity } Q = \left[1 - \sum_{1}^{12} An \frac{1}{1 + \exp(20(V - (2.9 + 0.1(n-1))))}\right] \times \text{full charging capacity} \quad (4)$$

where A and V denote a constant and a voltage, respectively.

Figure 6:
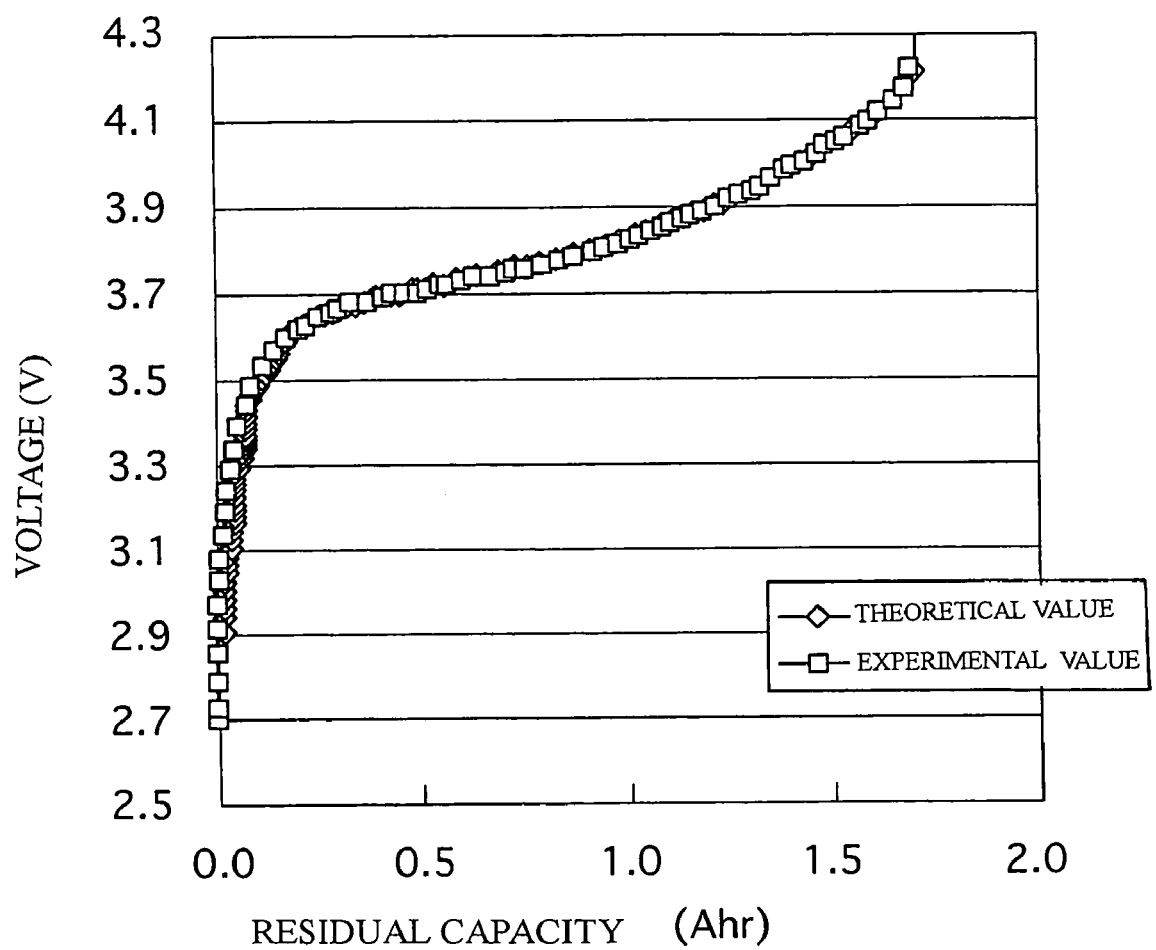
FIG. 6 is a graph showing a theoretical reference discharge curve, represented by the equation (4), and a discharge curve, re-calculated from a discharge curve at a discharge current value at 0.8 A of an initial battery, with the aid of the corrected voltage V as found by the equation (3).

FIG. 6 shows the reference discharge curve, represented by the equation (4), and the discharge curve, re-calculated from the discharge curve at the discharge current of 0.8 A of the initial battery, with the corrected voltage V as found by the equation (3). Since the discharge curve derived from the measured value and the discharge curve derived from the theoretical values indicate good coincidence with each other, it has been found that the discharge curve derived from the theoretical values may be used as the reference discharge curve.

Figure 7:
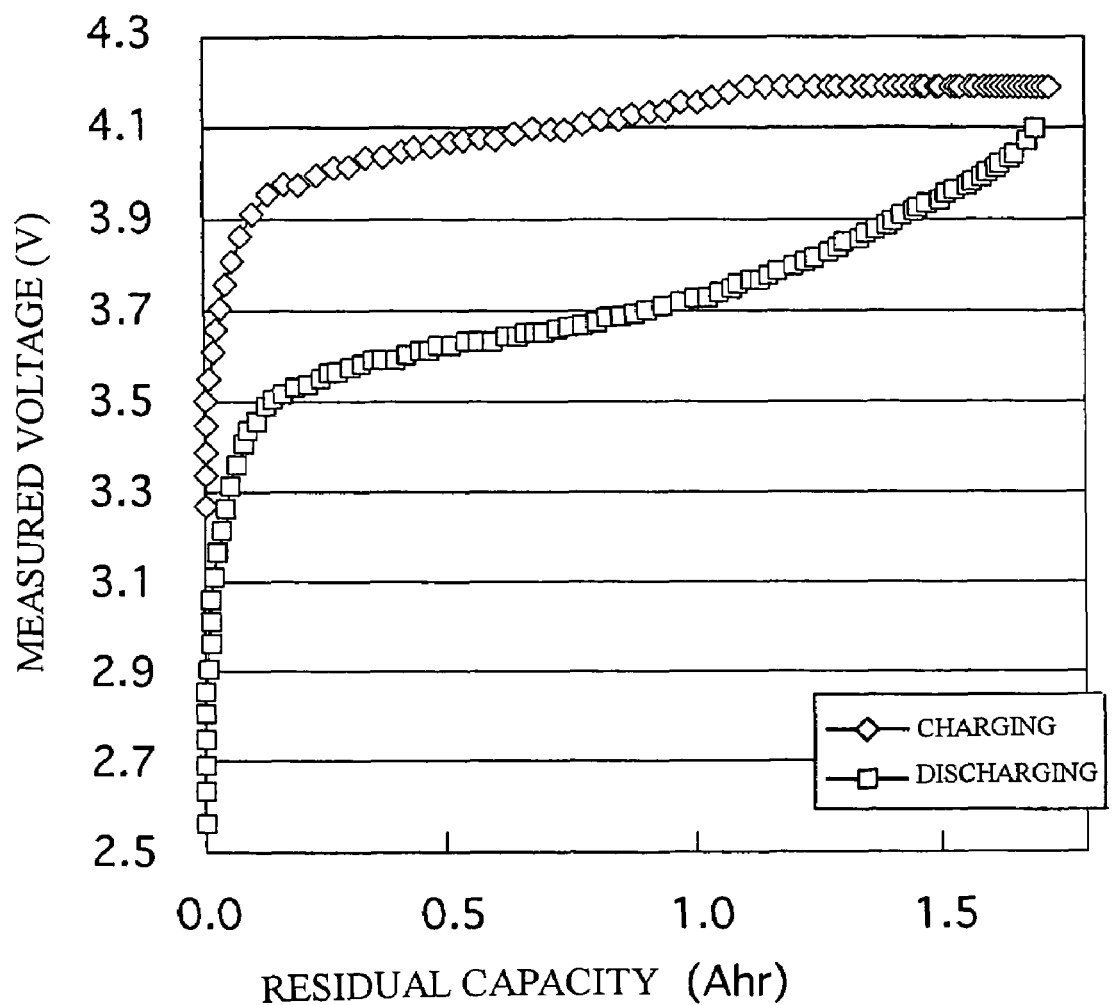
FIG. 7 is a graph showing the shape of customary charging and discharge curves, with a measured voltage V1 and the capacity being plotted on the ordinate and on the abscissa, respectively.

Meanwhile, the profiles of the customary charging and the discharge curves, in which the measured voltage and the capacity are plotted on the ordinate and on the abscissa, respectively, are not coincident with each other, as indicated in FIG. 7. Meanwhile, in FIG. 7, not the residual capacity but the capacity is plotted on the abscissa, as customarily. Thus, the discharge curve should inherently be inclined from upper left to lower right in the drawing such as to intersect the charging curve. However, in FIGS. 7 and 8, the discharge curve is shown as it is inverted with respect to the capacity, for ease in understanding. The reference discharge curve may also be set based on the measured values as found from the difference between the open circuit potential function of the cathode and the open circuit potential function of the anode.

The present inventors have conducted researches as to whether or not these curves coincide with each other, based on the concept of voltage correction described above. For charging, the constant current of 1 A is supplied to the battery and, when the voltage of 4.2V is reached, the charging mode is changed over to constant voltage charging of 4.2V at which voltage the battery is maintained for three hours by way of performing constant current constant voltage charging. After charging, the battery was discharged at a discharge current of 0.4 A. The charging voltage was corrected in accordance with the following equation (5), $$\text{corrected voltage } V = \text{measured voltage } V1 - IR - \eta \quad (5)$$

in which IR and η are defined as in the above equation (3).

Figure 8:
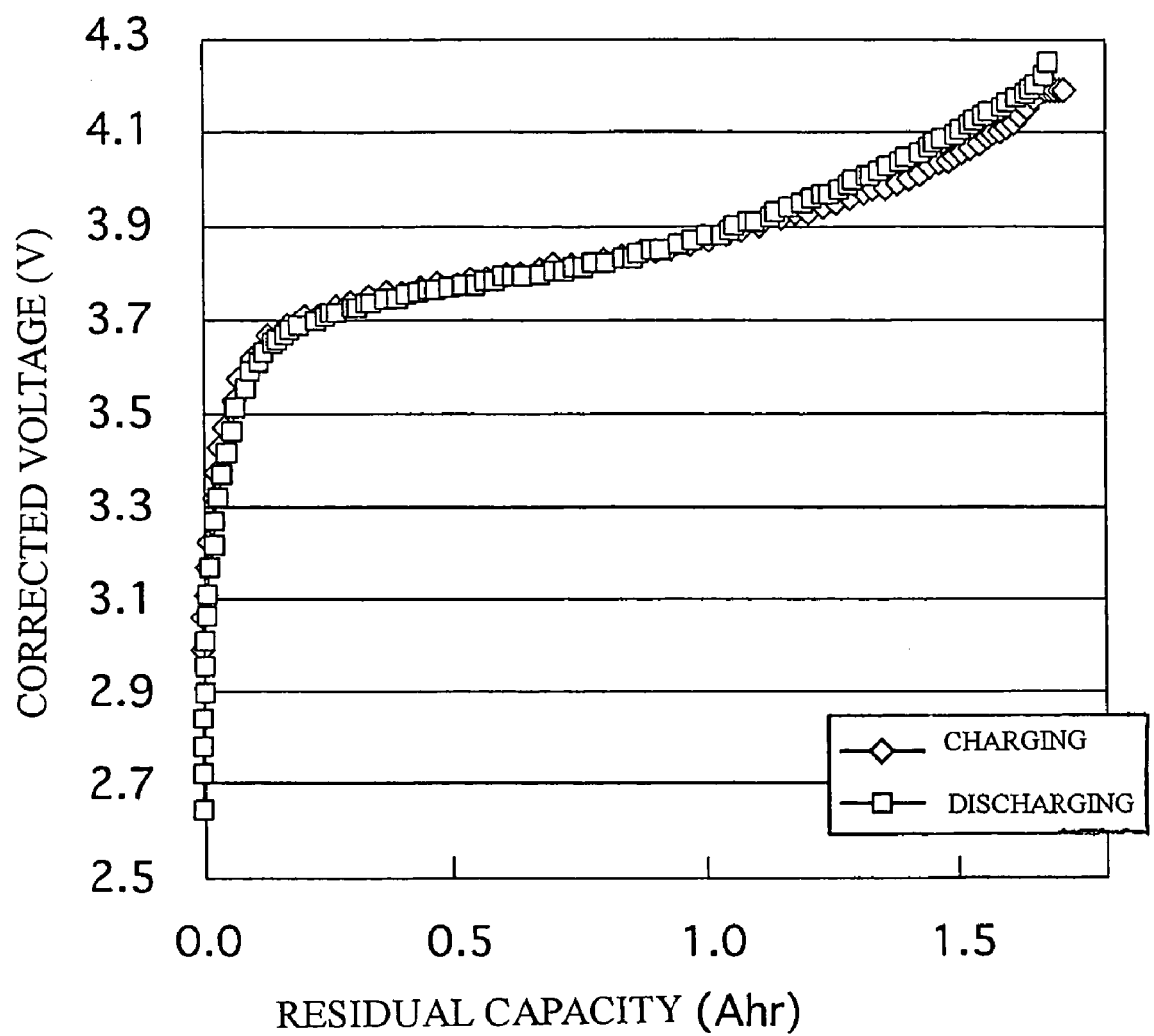
FIG. 8 shows correction of the charging curve and the discharge curve shown in FIG. 7, and more specifically depicts a graph in which the correction voltage V and the capacity are plotted on the ordinate and on the abscissa, respectively.

A charging curve and a discharge curve, in which the corrected voltage V, corrected in accordance with the equation (5), are plotted on the ordinate and on the abscissa, respectively, are shown in FIG. 8. It is seen that the charging curve and the discharge curve coincide highly satisfactorily in FIG. 8, following the correction, as compared to those in FIG. 7 prior to correction. That is, it may be understood that the concept of the present invention is electrochemically highly reasonable because it has been shown with the customary concept of the voltage correction that the profile of the charging curve is the same as that of the discharge curve. The above results indicate that, even under the charging state, the internal resistance can be estimated by voltage correction.

Figure 9:
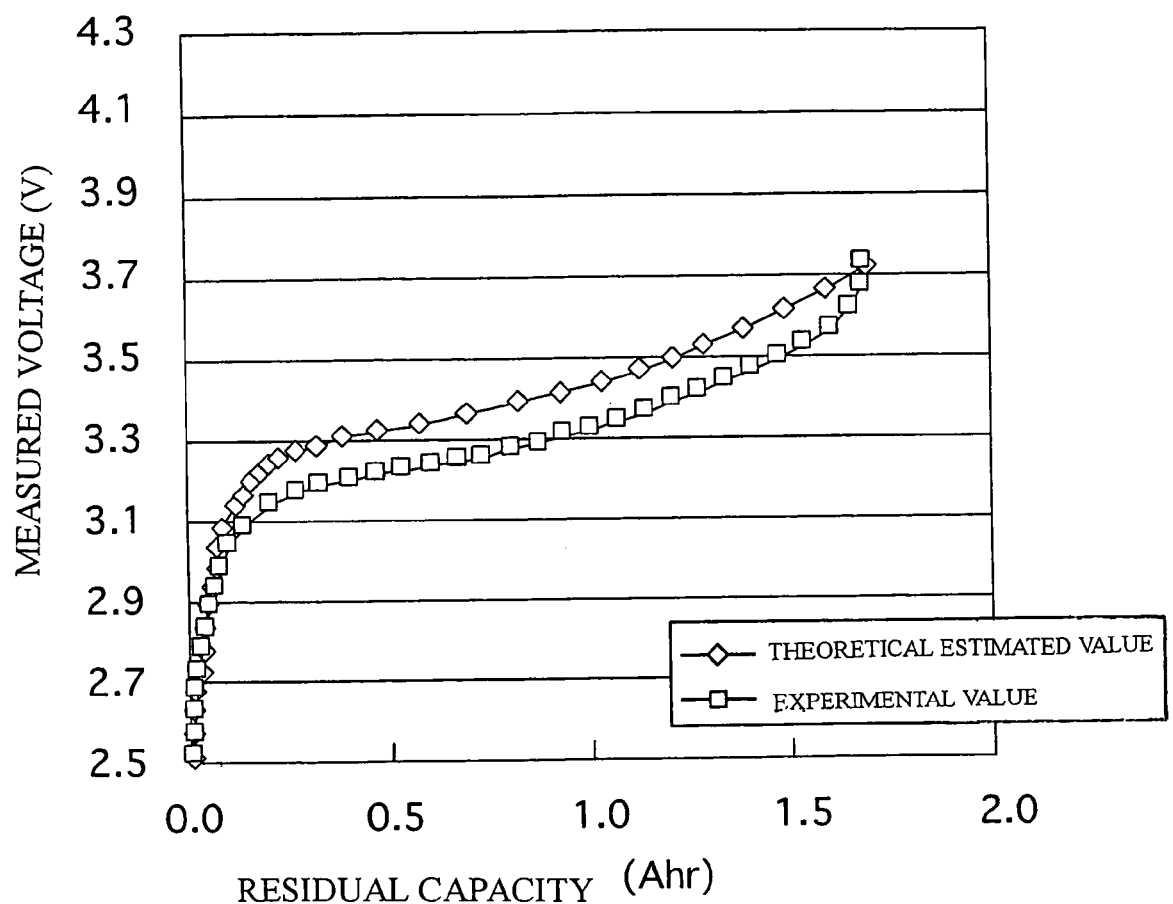
FIG. 9 is a graph showing a discharge curve, re-calculated using the corrected voltage V, from a discharge curve obtained on discharging the initial state battery with 2 A, and more specifically is a graph showing the case of using the equation (3) in finding the corrected voltage V.

The manner of finding the corrected voltage V in case of discharging with the large current is now explained. FIG. 9 shows a discharge curve when a battery in an initial state is discharged at a discharge current of 2 A and re-calculated using the equation (3). A theoretical reference discharge curve, as found from the open circuit potential function, is also shown in FIG. 9. Since the discharge curve after the correction shows a low voltage on the whole, as compared to the reference discharge curve, there is a fear that, with the correction consisting in the combination of the voltage derived from the internal resistance R of the equation (1) and the term of the overvoltage η which is based on the Butler-Bolmer theory of the equation (3), the capacity calculation is lowered in accuracy in case the battery is discharged with the large discharge current such as the discharge current of 2 A.

Thus, for further improving the accuracy in capacity calculations, the method of correcting the measured voltage V1 by the voltage V2 derived from the internal resistance and by a voltage correction term ø which is the current dependent resistance derived voltage V3 and which is based on the Nernst' marginal diffusion theory is hereinafter explained as a third method for calculating the corrected voltage V.

The voltage correction term ø, shown by the following equation (6) is found by adding the Nernst' diffusion term to the above equation (2) which is based on the above-mentioned Butler-Bolmer theory and by rewriting and simplifying the equation.

$$\phi = \frac{2.3RT/(\alpha nF) \cdot \log(I/0.1)}{[1 - 0.3 \times 2.3RT/(\alpha nF \cdot \log(I/0.1)/(1/(1+I^2)))]} \quad (6)$$

The voltage correction term ø is the current dependent resistance derived voltage V3 for a large discharge current. The following equation (7) is obtained by employing the voltage correction term ø in place of the overvoltage η in the equation (2).

$$\text{corrected voltage } V = \text{measured voltage } V1 + IR + \varnothing \quad (7)$$

Figure 10:
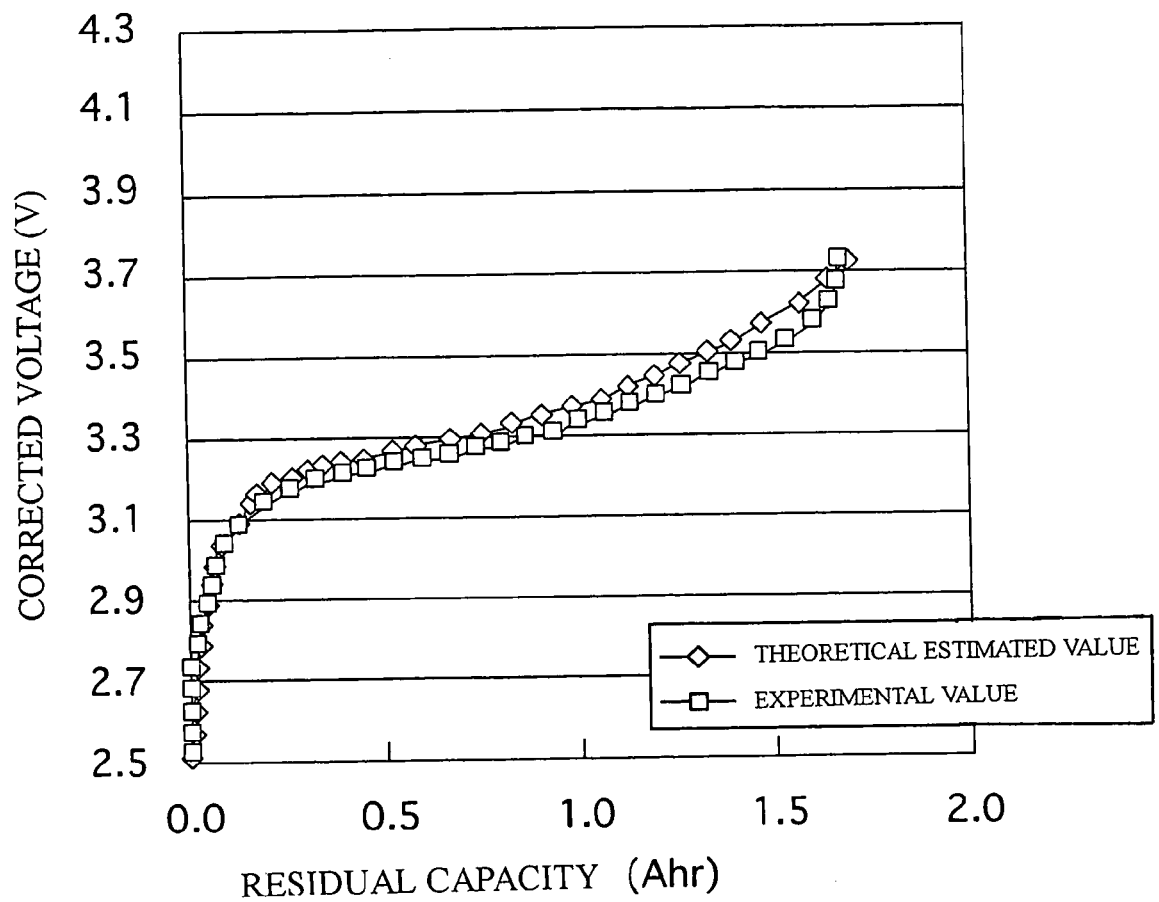
FIG. 10 is a graph showing a discharge curve, recalculated using the corrected voltage V, from a discharge curve obtained on discharging the initial state battery with 2 A, and more specifically is a graph showing the case of using the equation (7) in finding the corrected voltage V.

FIG. 10 shows the discharge curve of FIG. 9, re-calculated using the corrected voltage V, obtained by this equation (7). Comparison of FIGS. 9 and 10 reveals that the degree of coincidence between the discharge curve at a larger current and the theoretical reference discharge curve has been improved as a result of the re-calculations with the corrected voltage V, obtained by inclusion of the Nernst's diffusion term.

Figure 11:
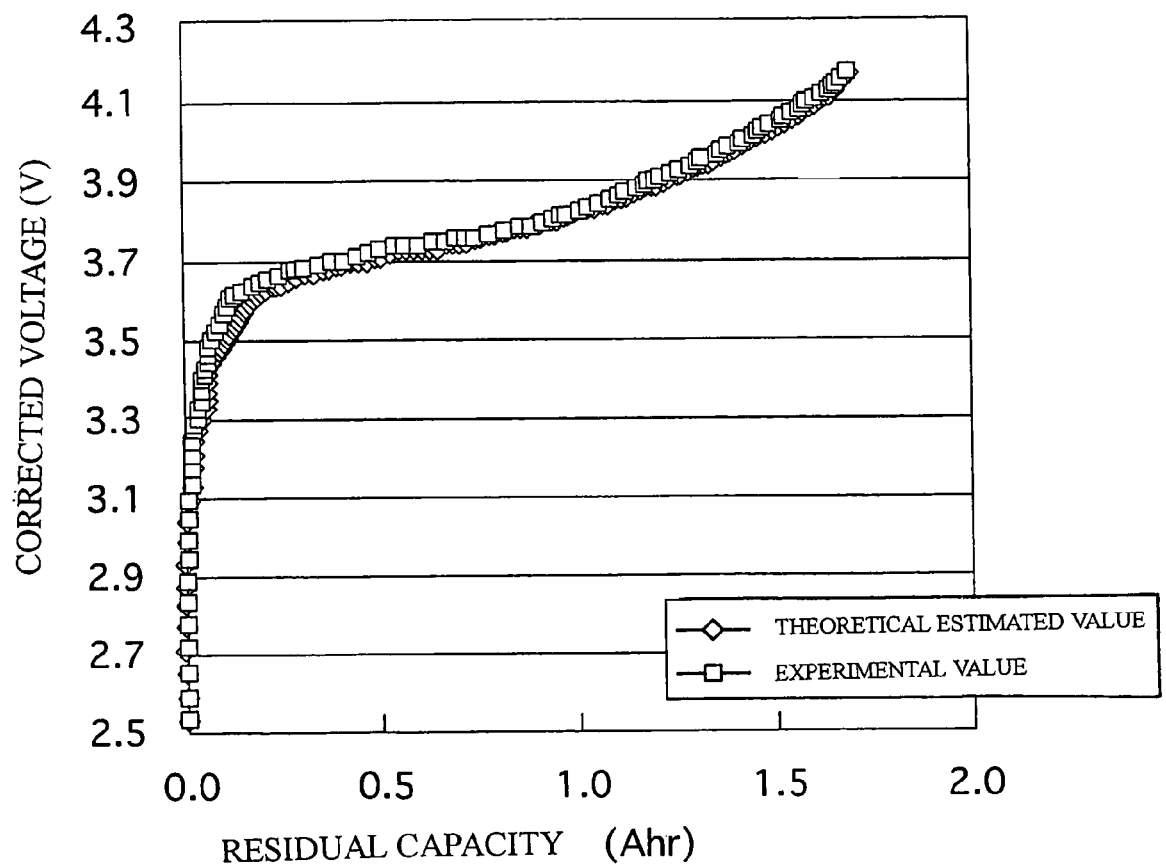
FIG. 11 is a graph showing a discharge curve re-calculated using the corrected voltage V, from a discharge curve obtained on discharging the initial state battery with 0.1 A, and more specifically is a graph showing the case of using the equation (7) in finding the corrected voltage V.

A discharge curve with a discharge current of 0.1 A, re-calculated using the corrected voltage V, obtained by this equation (7), is shown in FIG. 11. It is seen from this figure that a high degree of coincidence with the reference discharge curve may be noted even with the discharge current of 0.1 A. Thus, it may be appreciated that, by employing the corrected voltage V, obtained in this equation (7), capacity calculations may be improved in accuracy, without dependency on whether the load is light or heavy.

Meanwhile, the charging and discharging conditions, discussed in the foregoing, are premised on the use of the ambient temperature. However, the battery may be used in a frigid area, so that a need exists for a method which permits accurate capacity measurement even under the low temperature environment. Thus, as a fourth method for calculating the corrected voltage V, a method consisting in correcting the measured voltage V1 using, in addition to the above-mentioned voltage derived from the internal resistance V2 and the current dependent resistance derived voltage V3, a voltage dependent resistance derived voltage V4, with a view to improving capacity measurement accuracy under a low temperature environment, is hereinafter explained.

A discharge curve, measured under a low temperature environment of from 0° C. to −20° C., was tentatively recalculated, using the corrected voltage V as found from the equation (3) or (4). It was found that an error was increased with this discharge curve as compared to the discharge curve at ambient temperature, discussed in the foregoing. The increased error is presumably ascribable to the voltage dependent resistance, which becomes predominant at a lower temperature and, in particular, to resistance against ion drifts due to the gradient of the electrical field in an electrolytic solution. Thus, by approximation from the theory on the ion flow velocity, a voltage correction term δ as indicated by the following equation (8), $$\delta = CV \cdot \exp(-DV)/(\exp(-DV)-1) \quad (8)$$

where V denotes a voltage and C, D denote constants, is found.

The voltage correction term δ as found by the equation (8) is added to the above equation (3) to give the following equation (9).

$$\text{corrected voltage } V = \text{measured voltage } V1 + IR + \eta - \delta \quad (9)$$

The corrected voltage V, as found from the equation (9), is used in the following equation (10) to find Vc, which Vc is substituted for a variable V in the function h(V) of the reference discharge curve under the low temperature environment.

$$Vc = \text{measured voltage } V1 + IR + \eta - \delta - k \cdot I2/V \quad (10)$$

In the above equation (10), k denotes a constant, and k·I2/V is an empirical term.

Thus, the reference discharge curve under the low temperature environment may be expressed by the following equation (11).

$$\text{residual capacity } Q = h(Vc) \quad (11)$$

In actuality, the reference discharge curve under the low temperature environment may be found by introducing Vc into the exponential function of the equation (4). Since the discharge curve is changed appreciably under a low temperature environment, the reference discharge curve cannot be made to converge into one curve. It is therefore necessary to select an optimum constant k, depending on the environmental temperature and the current, in order to take a plural number of reference discharge curves into account.

Figure 12:
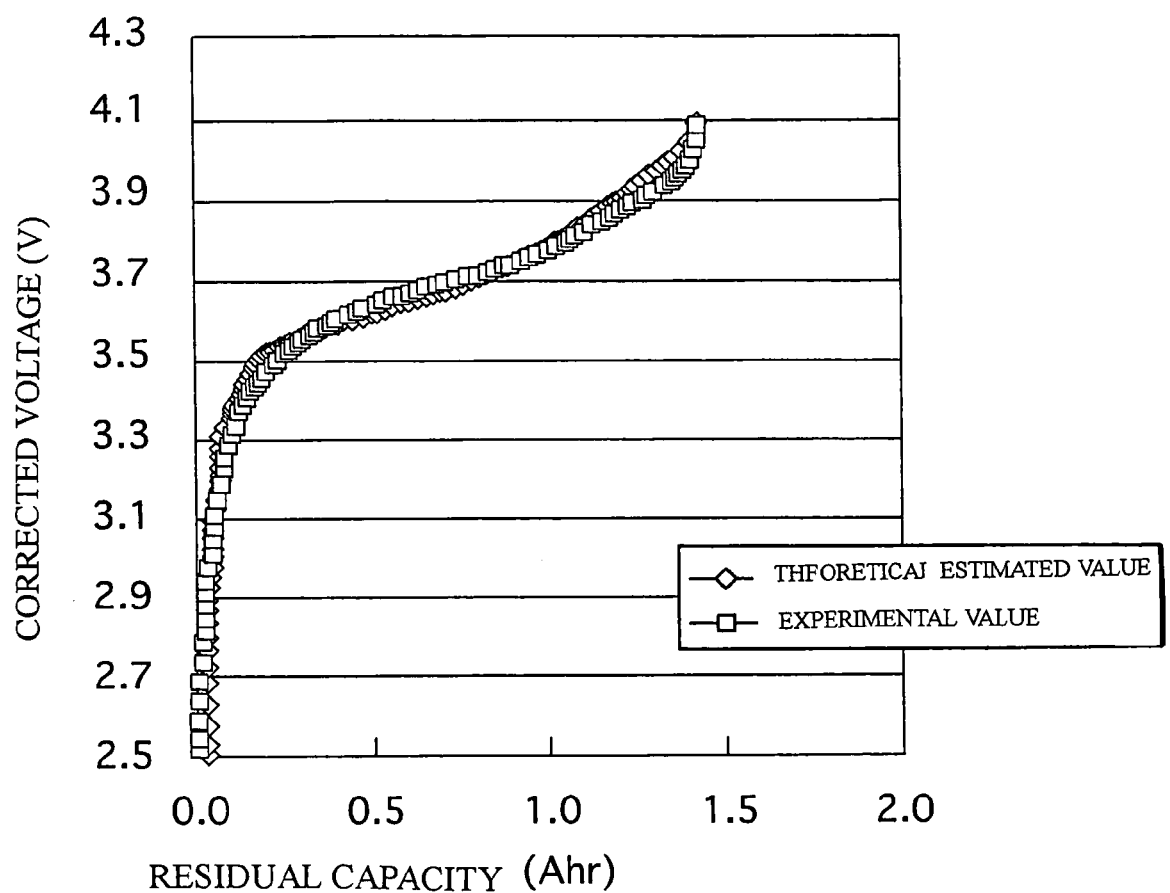
FIG. 12 is a graph showing a discharge curve with a discharge current of 0.1 A of the initial state battery at 0° C., as corrected using the equation (10), and a reference discharge curve.
Figure 13:
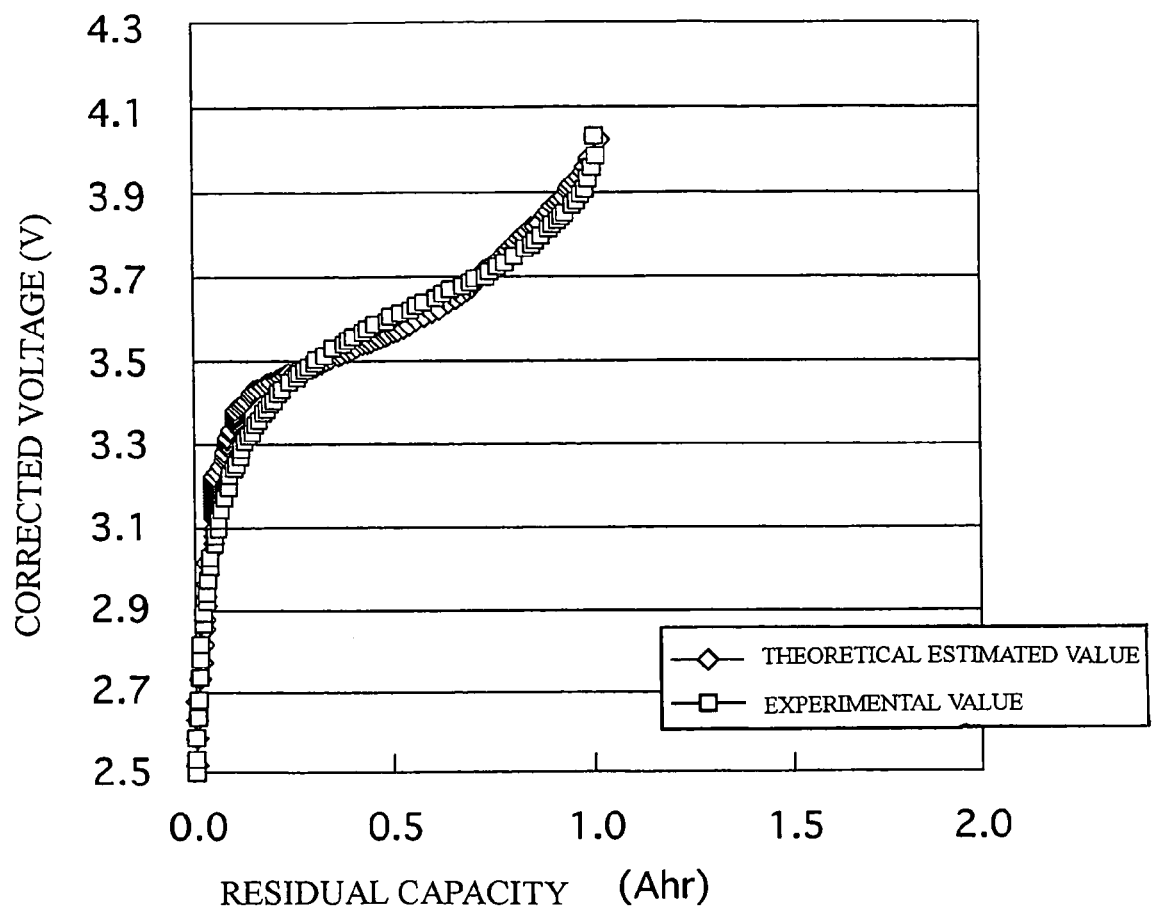
FIG. 13 is a graph showing a discharge curve with a discharge current of 0.1 A of the battery at the 300th cycle, at 0° C., as corrected using the equation (10), and a reference discharge curve.
Figure 14:
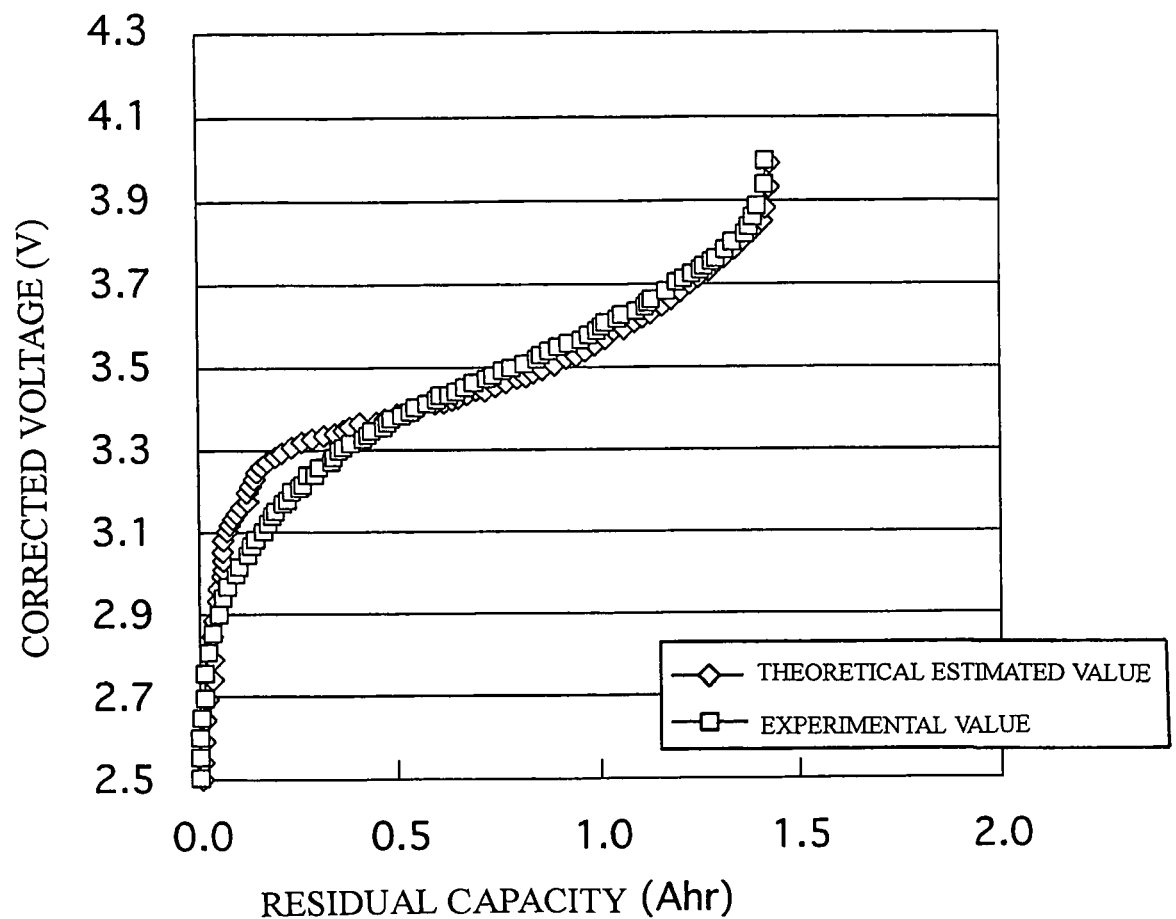
FIG. 14 is a graph showing a discharge curve with a discharge current of 0.4 A of the battery at the 300th cycle, at 0° C., as corrected using the equation (10), and a reference discharge curve.
Figure 15:
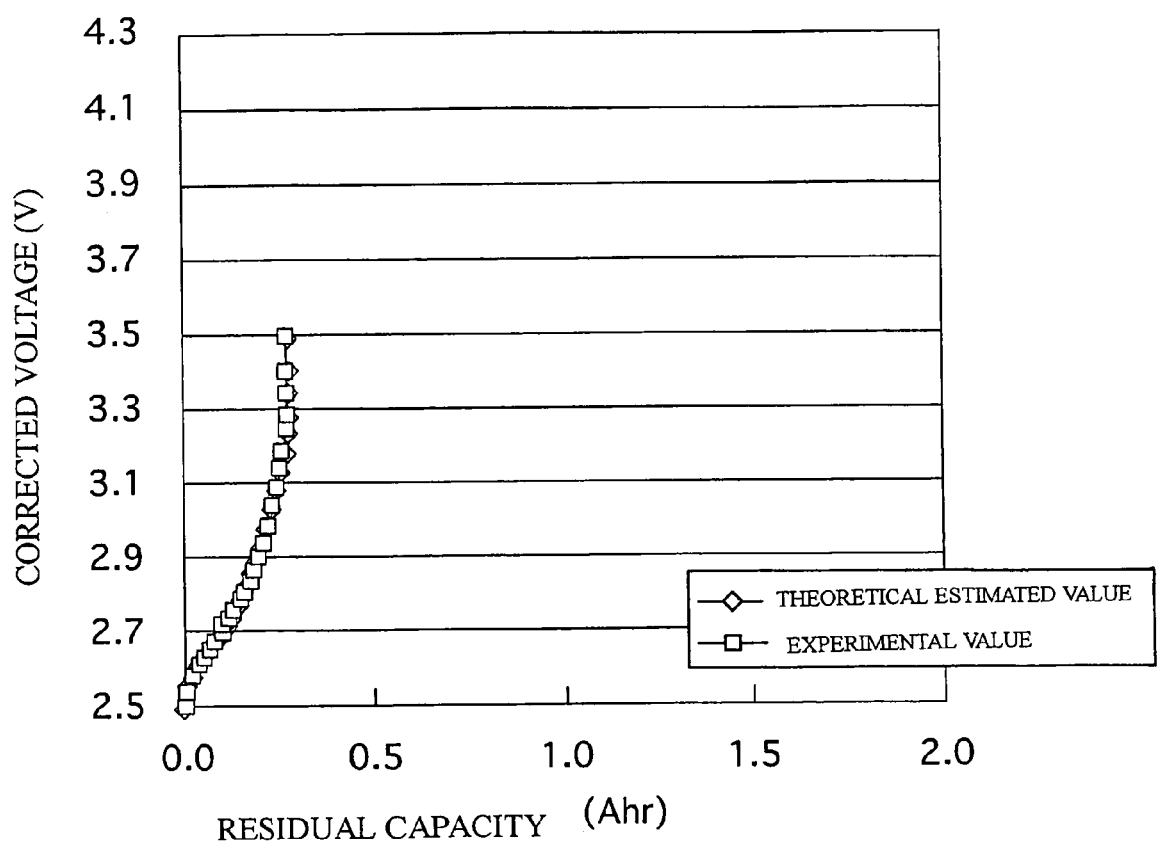
FIG. 15 is a graph showing a discharge curve with a discharge current of 0.4 A of the battery at the 300th cycle, at −20° C., as corrected using the equation (10), and a reference discharge curve.

The results of correction of the discharge curve of the battery of the initial state at 0° C., at the discharge current of 0.1 A, and the reference discharge curve, with the aid of Vc, as found from the equation (10) are shown in FIG. 12. The results of correction of the discharge curve of the battery at 0° C., at the discharge current of 0.1 A, at the 300th cycle, and the reference discharge curve, with the aid of Vc, as found from the equation (10), are shown in FIG. 13. The results of correction of the discharge curve of the battery of the initial state at 0° C., at the discharge current of 0.4 A, and the reference discharge curve, with the aid of Vc, as found from the equation (10), are shown in FIG. 14. The results of correction of the discharge curve of the battery at −2020 C., at the discharge current of 0.4 A, at the 300th cycle, and the reference discharge curve, with the aid of Vc, as found from the equation (10), are shown in FIG. 15.

Although not shown, experiments were conducted under conditions different from those indicated by the discharge curves of FIGS. 12 to 15, namely, under the totality of combinations of the discharge current of 0.1 A, 0.2 A, 0.4 A, 0.8 A, 1 A and 2 A, and the environmental temperatures of 10° C., 0° C. and −20° C., for batteries of the initial stage and at the 100th, 200th, 300th, 400th and 500th cycles, and respective discharge curves were corrected based on the corrected voltage V and a capacity deterioration index S, as later explained, for comparison with the reference discharge curve.

It was confirmed that, for any of the above combinations, the corrected discharge curves indicated approximate coincidence with the reference discharge curve. Thus, it may be asserted to be possible to improve the accuracy in the measurement of the battery capacity even under a low temperature environment.

The above concept for voltage correction is sufficiently valid insofar as the battery in the initial state is concerned. However, such is not the case with the battery deteriorated with the charging/discharging cycles, for which, with the above concept, the capacity cannot be estimated accurately. This will now be explained with reference to FIGS. 16 and 17.

Figure 16:
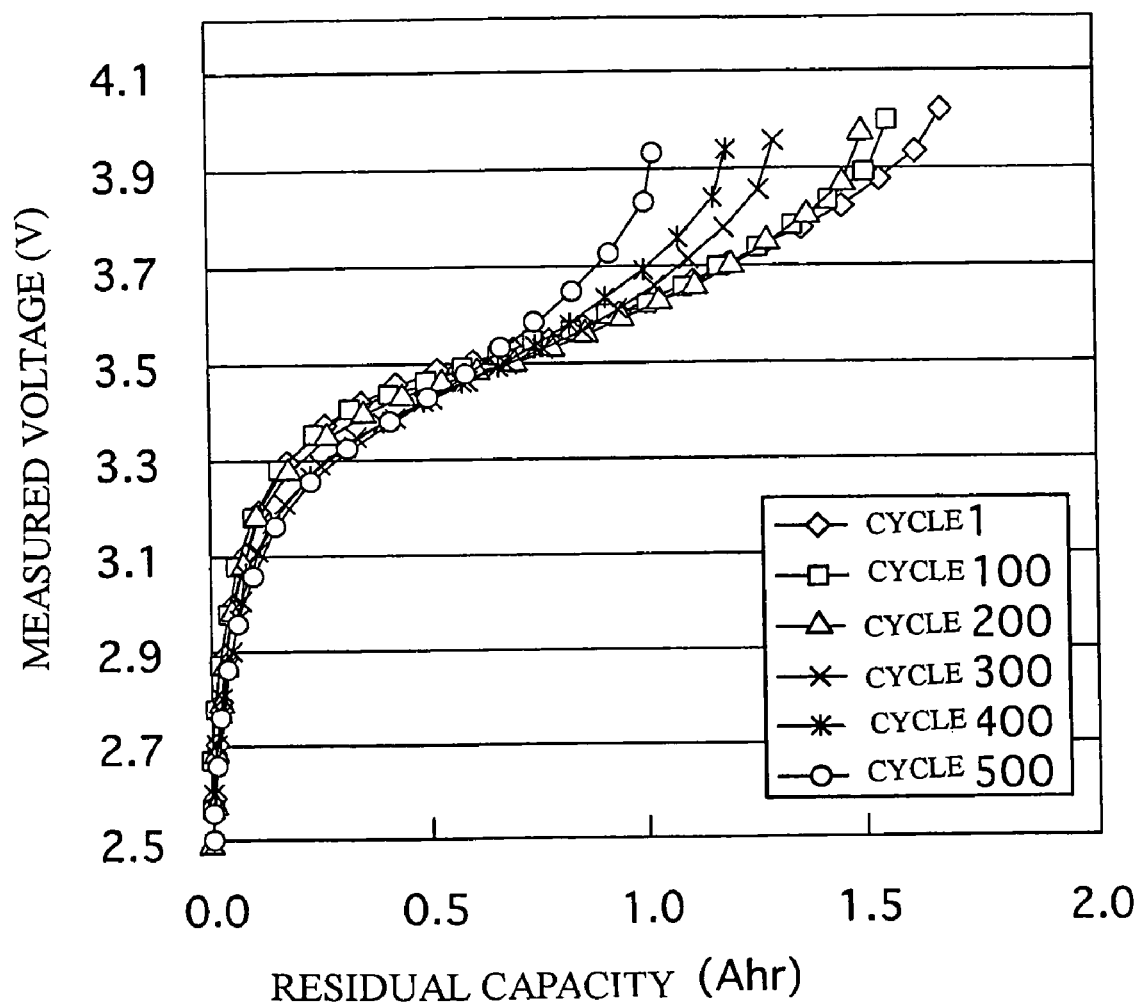
FIG. 16 is a graph showing discharge curves of the initial state, 100th cycle, 300th cycle, 400th cycle and at the 500th cycle.
Figure 17:
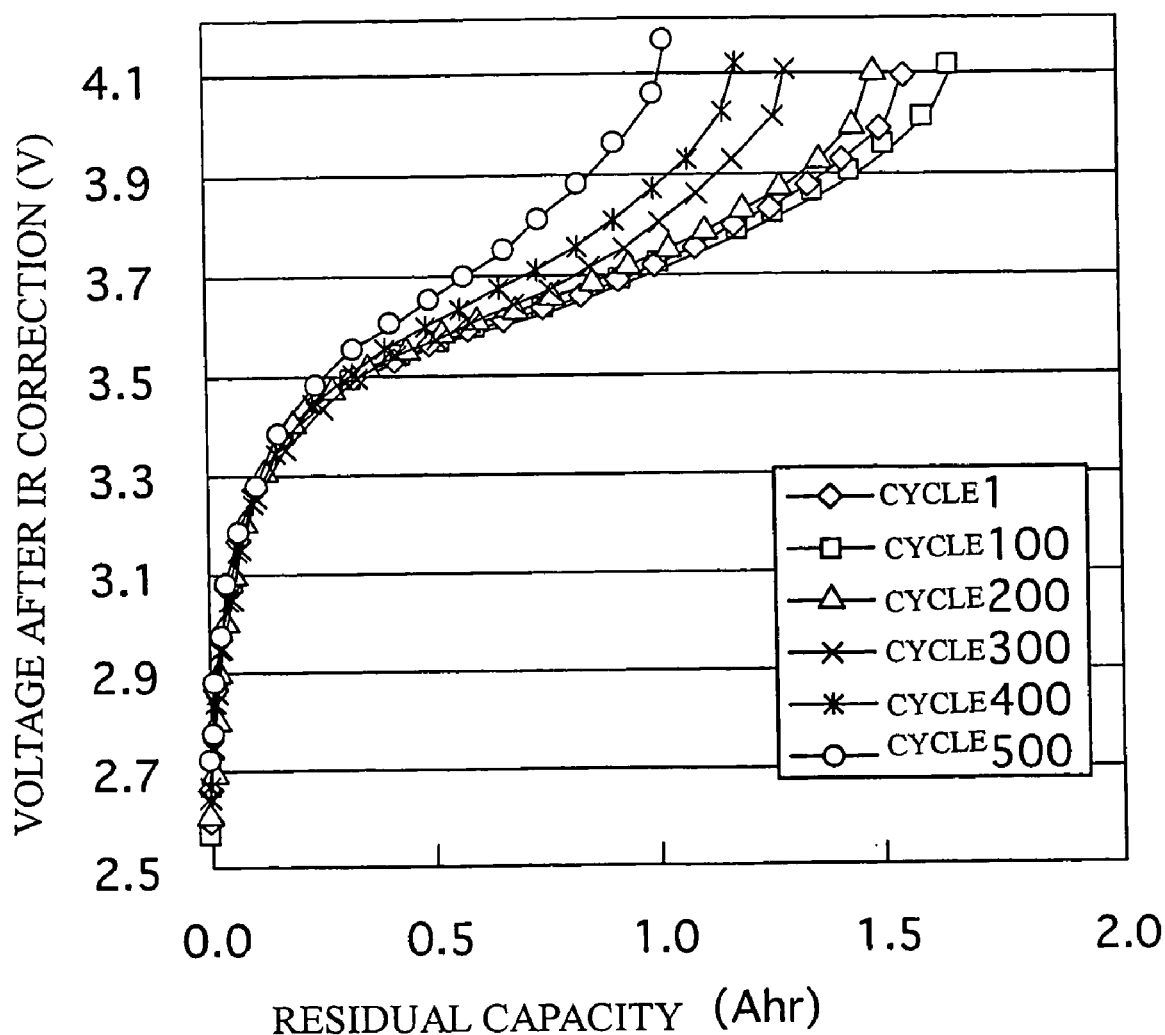
FIG. 17 is a graph showing a discharge curve, re-calculated, using the corrected voltage V, as found from the equation (1), from each discharge curve shown in FIG. 16.

The discharge curves for the initial state and at the 100th, 200th, 300th, 400th and the 500th cycles of an ordinary battery are shown in FIG. 16. The respective discharge curves, shown in FIG. 16, were re-calculated, using the corrected voltage V, as found by the equation (1) which takes only the internal resistance R of the battery into account. The results are shown in FIG. 17. It is noted that R in the equation (1) was set to 0.12, 0.19, 0.23, 0.26, 0.32 and to 0.43 for the initial state and for the 100th, 200th, 300th, 400th and 500th cycles, respectively.

As may be seen from FIG. 17, the discharge curve of the battery of the initial state showed an extremely poor state of coincidence with that of the battery at the 100th cycle and at the higher cycles, despite the correction employing the equation (1). Specifically, by the above correction, the discharge curve of the deteriorated battery showed approximate coincidence, in the terminal discharge area, with the discharge curve of the battery in the initial state. On the other hand, the discharge curve showed marked deviation of the discharge curve in a voltage area of 3.5V or higher. The reason is that, with the progress of the charging/discharging cycles, deterioration of the battery proceeds, such that the full charging capacity of the battery was decreased appreciably. It is noted that the deviation of the discharge curve for a voltage area of 3.5V or higher can hardly be corrected, as in the case of the equation (1), even if the voltage is corrected such as to take account of the overvoltage η of the above equation (3).

In light of the foregoing, the method of further raising the accuracy in calculating the residual capacity by multiplying the reference discharge curve with a capacity deterioration index S, which takes into account the decreasing full charging capacity attendant on the battery deterioration, as additional measures to the above-described concept of the voltage correction, is hereinafter explained.

As in the above equation (4), the reference capacity Q, which is based on the reference discharge curve, may be represented, as a function of the voltage V, as indicated by the following equation (12).

$$\text{reference capacity } Q=f(V) \quad (12)$$

The function indicating the capacity of the deteriorated battery is indicated as g (corrected voltage V), in terms of the corrected voltage V. If this function is presumed to be the reference discharge curve multiplied with the capacity deterioration index S, as a measure of the capacity decreasing ratio, the function for finding the capacity of the deteriorated battery may be represented by the following equation (13). The capacity deterioration index S fulfills $0 \leq S \leq 1$ in the equation. The measurement method of this capacity deterioration index S will be explained later.

$$\text{battery capacity } Q=g(\text{corrected voltage } V)=S\cdot f(V) \quad (13)$$

If simply the measured voltage is used as V in the equation (13), there is produced offset due to voltage drop at the initial stage of the discharge or to variations due to the measurement conditions. Thus, the correction voltage V, described above, is used. Re-writing the equation (13), the following equation (14).

$$f(V)=1/S\cdot g(\text{correction voltage } V) \quad (14)$$

Figure 18:
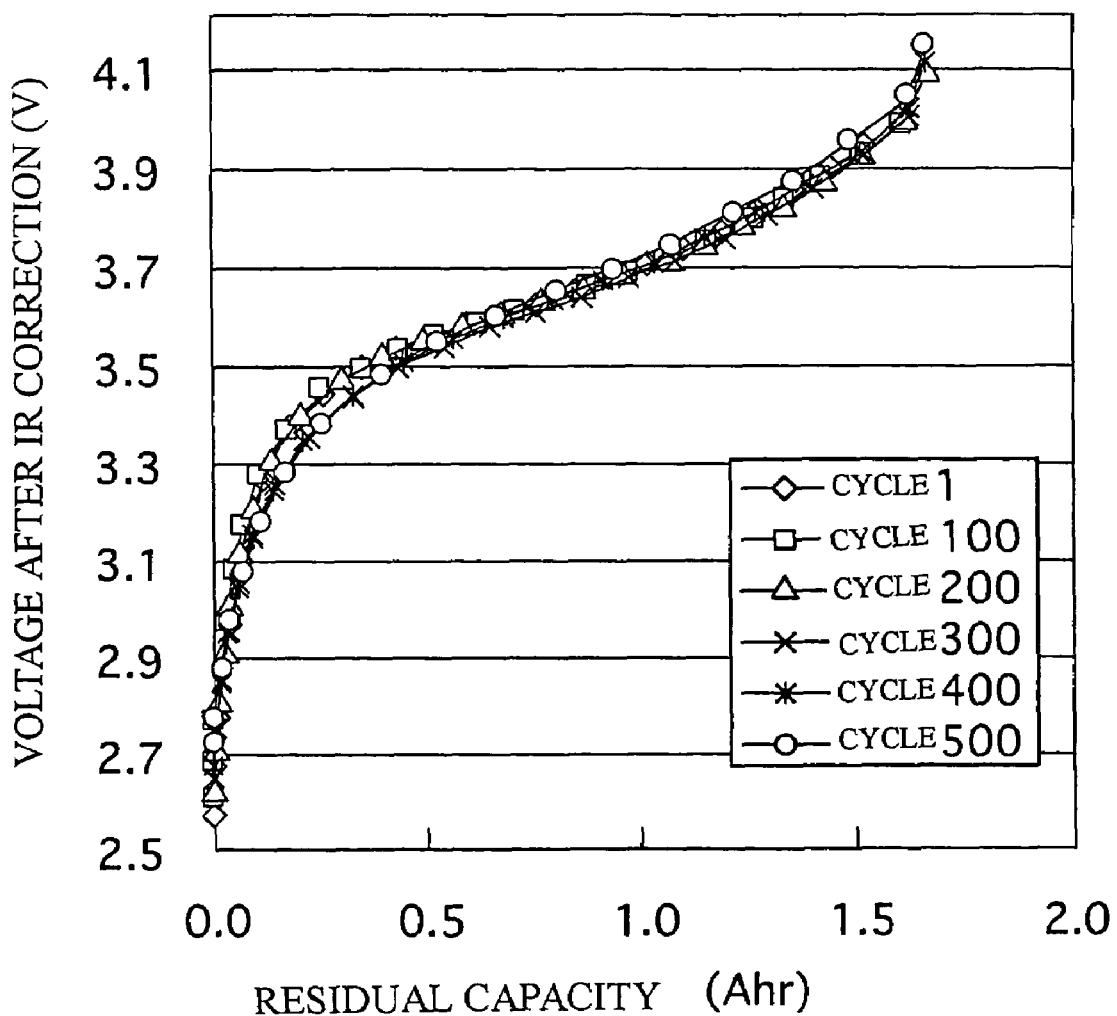
FIG. 18 is a graph showing a discharge curve re-calculated from each discharge curve shown in FIG. 17, in accordance with the equation (14).

The discharge curve, shown in FIG. 17, was re-calculated, in accordance with the equation (14), as the capacity deterioration index S was defined from one cycle to the next. The results are shown in FIG. 18, from which it is seen that the discharge curve of the deteriorated battery showed a high degree of coincidence with the reference discharge curve. Meanwhile, the reference discharge curve shown in FIG. 18 is the theoretical reference discharge curve, represented by the equation (4). The capacity deterioration index S was set to 1.00, 0.93, 0.911, 0.86, 0.79 and to 0.67, for the initial state and for the 100th, 200th, 300th, 400th and 500th cycles, respectively.

The above results may be said to indicate that, if the capacity deterioration index S and the battery resistance component for finding the corrected voltage V of a battery, which has been deteriorated and the residual capacity of which is unclear, could be estimated during use of the battery, the residual capacity may be calculated to a high accuracy subject only to measurement of the discharge voltage. Moreover, it is unnecessary to discuss the cause of the battery deterioration in calculating the residual capacity.

Figure 19:
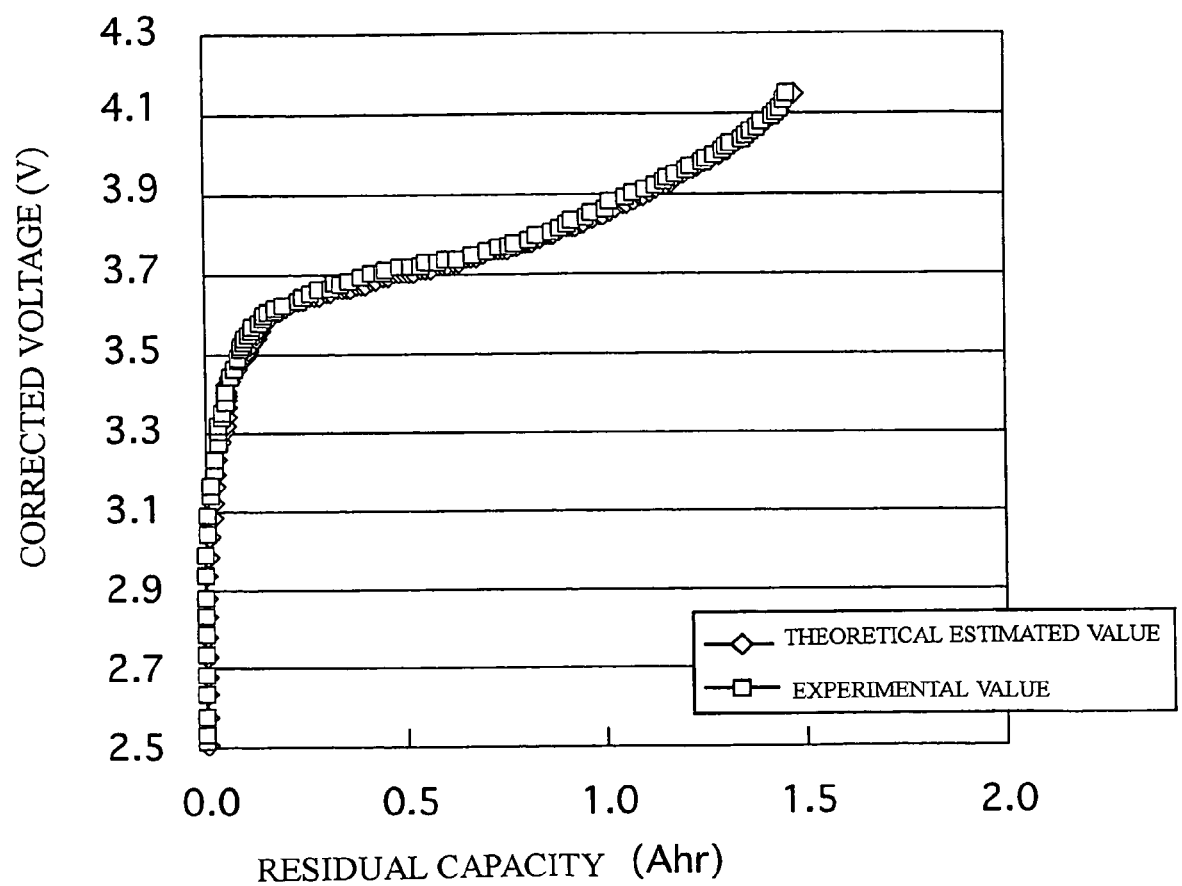
FIG. 19 is a graph showing a discharge curve with a discharge current of 0.1 A of the battery at the 300th cycle, at 20° C., as re-calculated using the equation (14), and a reference discharge curve.
Figure 20:
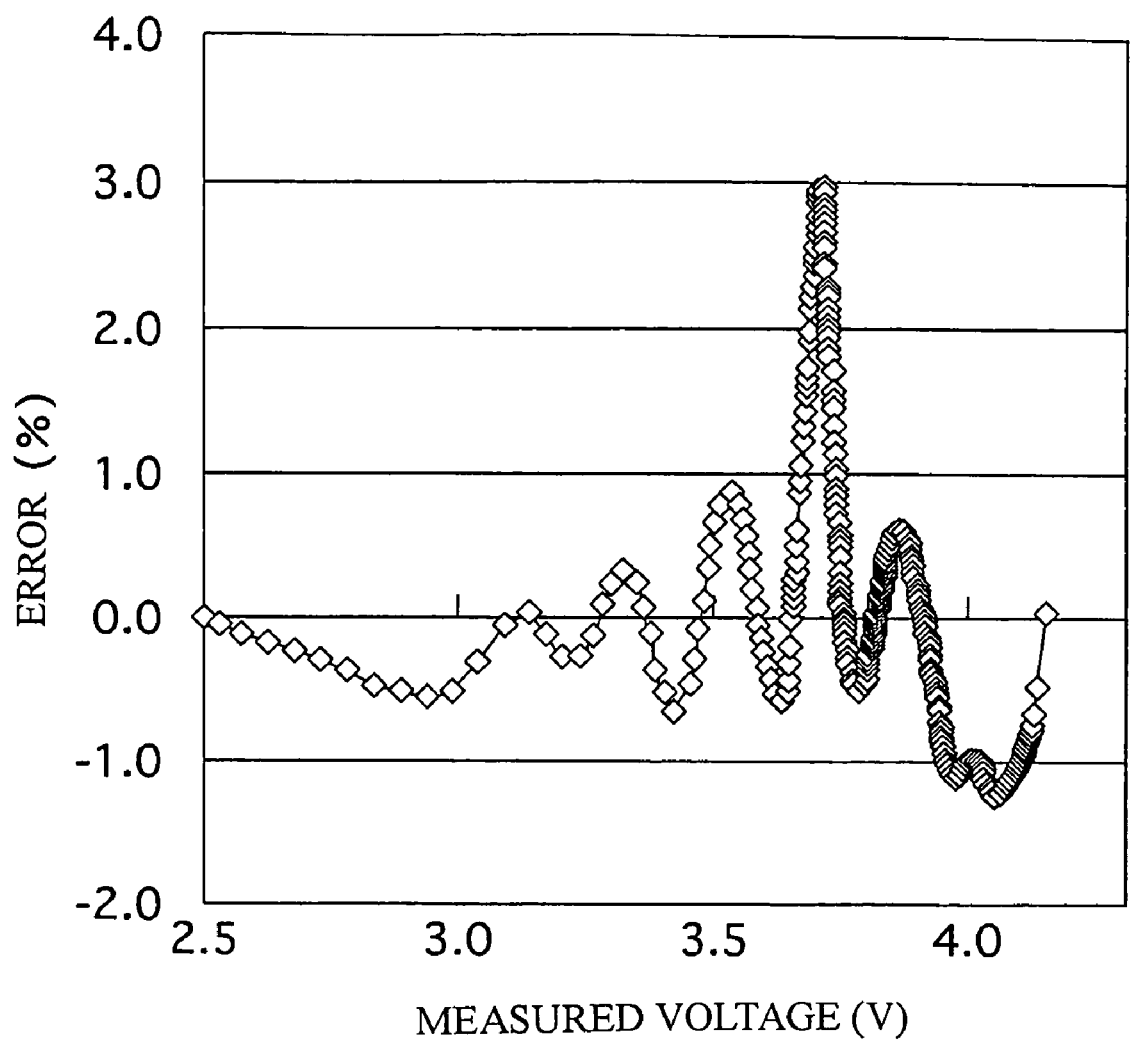
FIG. 20 is a graph showing a capacity error in each voltage of the discharge curve, re-calculated using the equation (14) shown in FIG. 19 and a reference discharge curve.

FIG. 19 shows a discharge curve, obtained on correcting the discharge curve at the discharge current of 0.1 A of a battery at the 300th cycle, at 200° C., as corrected by the equation (14), and the reference discharge curve. It may be seen from FIG. 19 that, by combining the corrected voltage V with the capacity deterioration index S, the discharge curve of the battery, deteriorated in the capacity, shows a high degree of coincidence with the reference discharge curve. FIG. 20 shows the difference between the capacity of the corrected discharge curve and that of the reference discharge curve for each voltage shown in FIG. 19. It may be seen that an error of the capacity of the corrected discharge curve from the capacity of the reference discharge curve is comprised within ±3%, indicating that highly accurate capacity measurement is possible.

Figure 21:
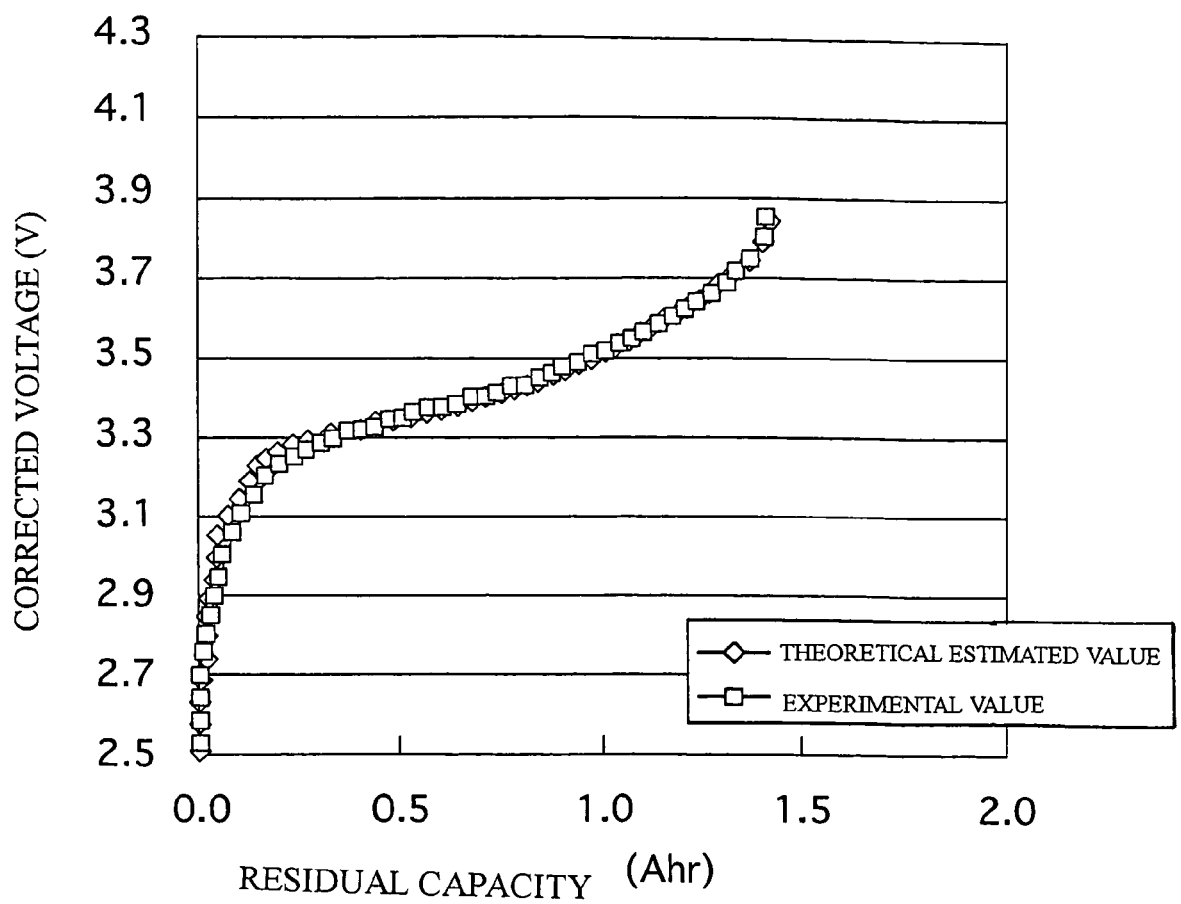
FIG. 21 is a graph showing a discharge curve with a discharge current of 1 A of the battery at the 300th cycle, at 20° C., as re-calculated using the equation (14), and a reference discharge curve.
Figure 22:
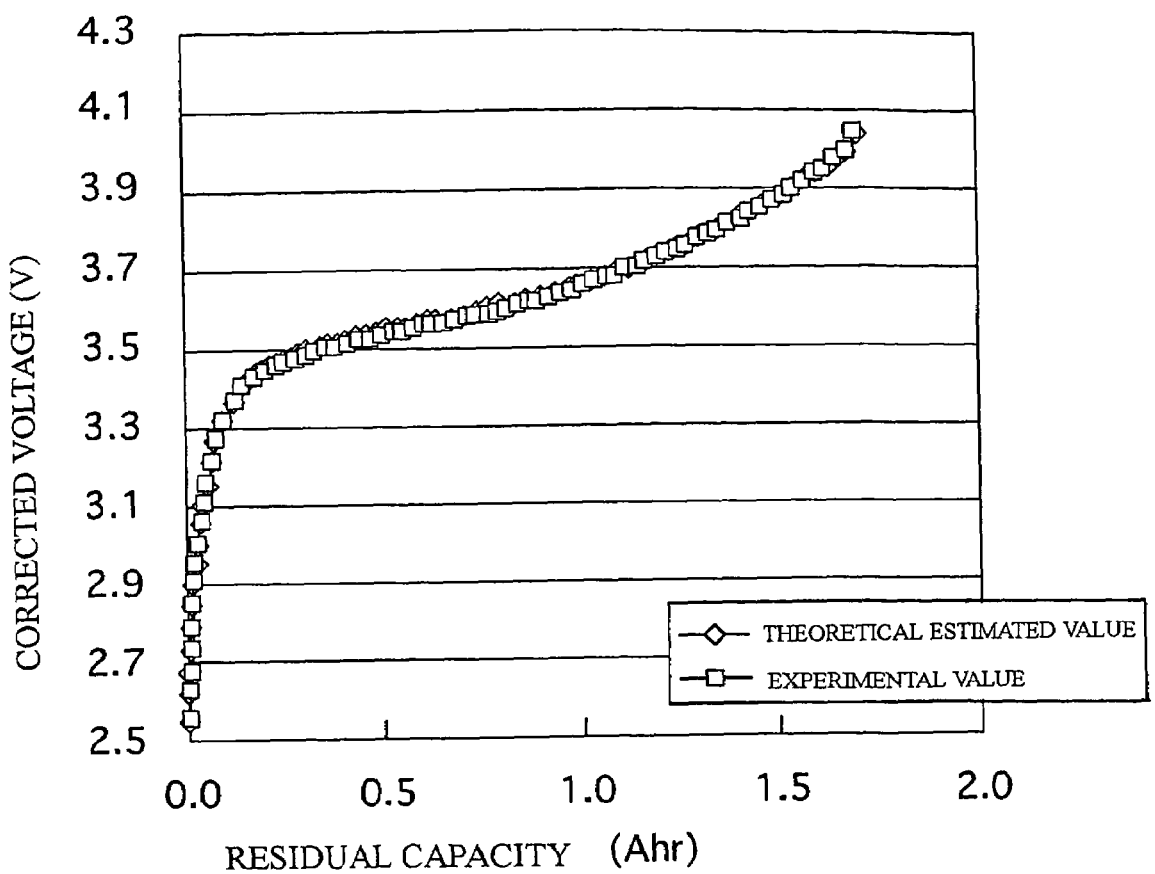
FIG. 22 is a graph showing a discharge curve with a discharge current of 0.8 A of the initial state battery, at 40° C., as re-calculated using the equation (14), and a reference discharge curve.
Figure 23:
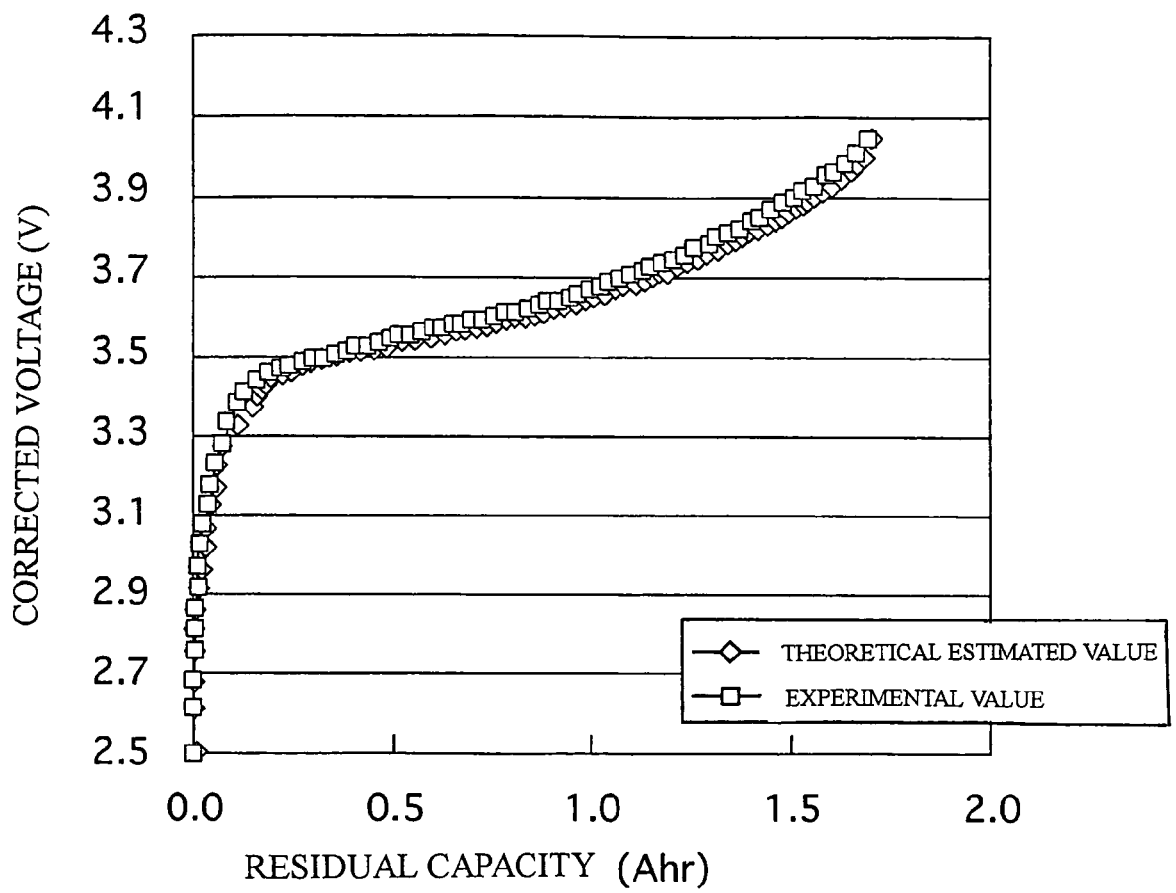
FIG. 23 is a graph showing a discharge curve with a discharge current of 0.8 A of the initial state battery, at 60° C., as re-calculated using the equation (14), and a reference discharge curve.
Figure 24:
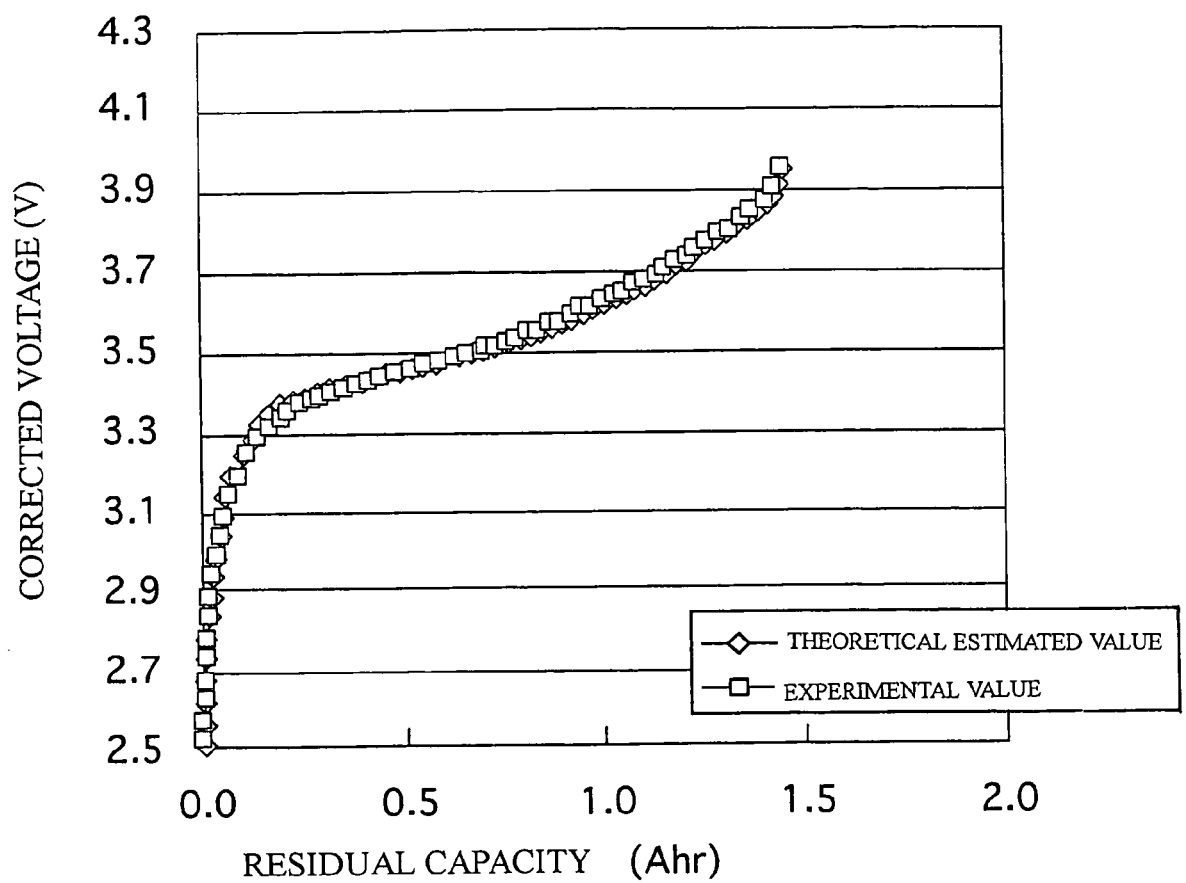
FIG. 24 is a graph showing a discharge curve with a discharge current of 0.8 A of the battery at the 300th cycle, at 40° C., as re-calculated using the equation (14), and a reference discharge curve.
Figure 25:
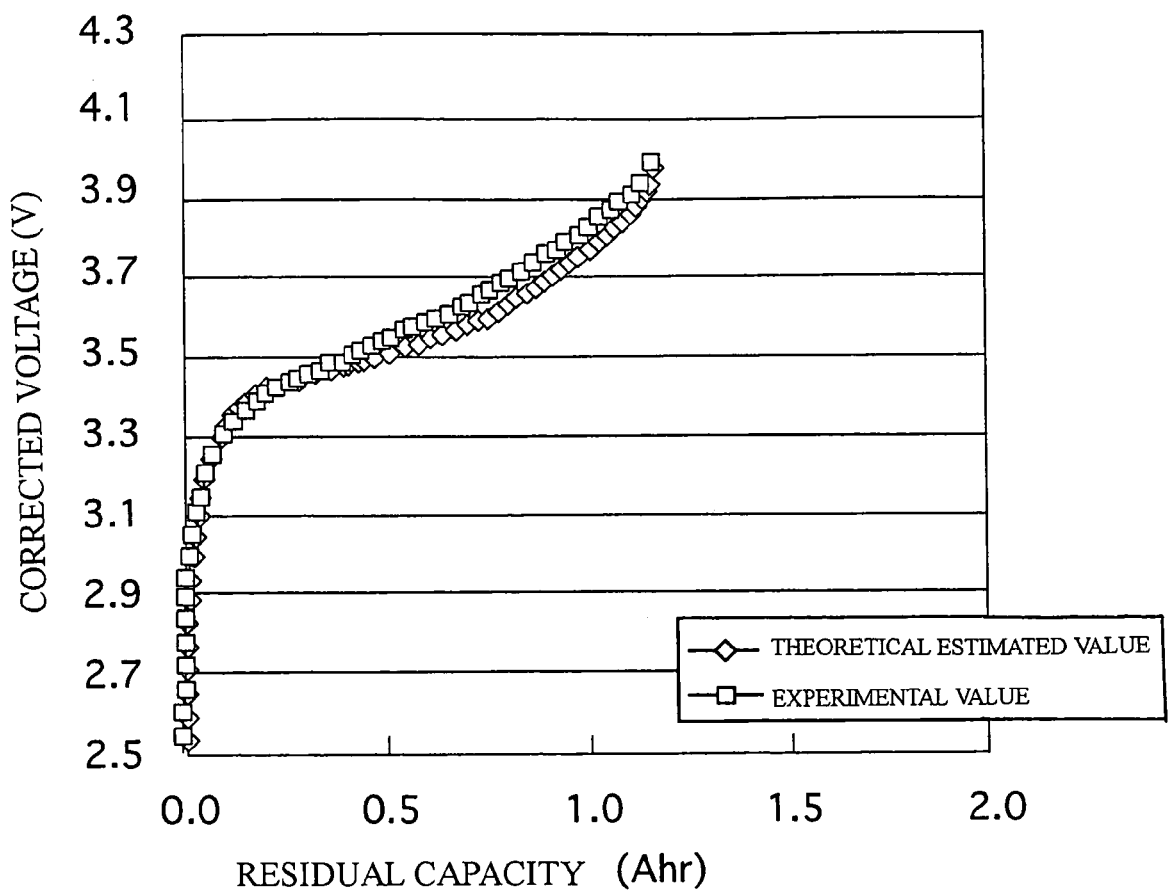
FIG. 25 is a graph showing a discharge curve with a discharge current of 0.8 A of the battery at the 500th cycle, at 40° C., as recalculated using the equation (14), and a reference discharge curve.

A discharge curve at the discharge current 1 A at the 300th cycle of the battery at 20° C., as corrected by the above equation (14), and the reference discharge curve, are shown in FIG. 21. A discharge curve at a discharge current of 0.8 A in an initial state of a battery at 40° C., as re-calculated using the corrected voltage V found by he equation (3), and the reference discharge curve, are shown in FIG. 22. A discharge curve at a discharge current of 0.8 A of a battery in an initial state at 60° C., as re-calculated using the corrected voltage V found by the equation (3), and the reference discharge curve, are shown in FIG. 23. A discharge curve at a discharge current of 0.8 A in the 300th cycle of a battery at 40° C., as corrected by the equation (14), and the reference discharge curve, are shown in FIG. 24. A discharge curve at a discharge current of 0.8 A of a battery at the 500th cycle and at 40° C., as corrected by the equation (14), and the reference discharge curve, are shown in FIG. 25.

Although not shown, experiments were conducted under conditions different from those indicated by the discharge curves of FIGS. 21 to 25, namely, under the totality of combinations of the discharge current of 0.1 A, 0.2 A, 0.4 A, 0.8 A, 1 A and 2 A and the environmental temperatures of 20° C., 40° C. and 60° C., for batteries of the initial stage and at the 100th, 200th, 300th, 400th and 500th cycles, and respective discharge curves were corrected based on the corrected voltage V and the deterioration index S, as later explained, for comparison with the reference discharge curve.

It was confirmed that the corrected discharge curve and the reference discharge curve show approximate coincidence for the above combinations except the case of the discharge current of 2 A, representing heavy load discharge, for which partially severe difference was noticed. Thus, it may be seen that the residual capacity can be estimated to an extremely high accuracy, simply by measuring the discharging capacity of a battery with an unknown residual capacity, if the corrected voltage V and the capacity deterioration index S are found, without dependency on the measurement conditions for the battery, such as the discharge current, state of deterioration, or environmental conditions of 20° C. to 60° C.

The method for calculating the voltage IR, derived from the internal resistance R of the battery, not dependent on the current or the voltage, as used in finding the corrected voltage V, is explained.

Figure 26:
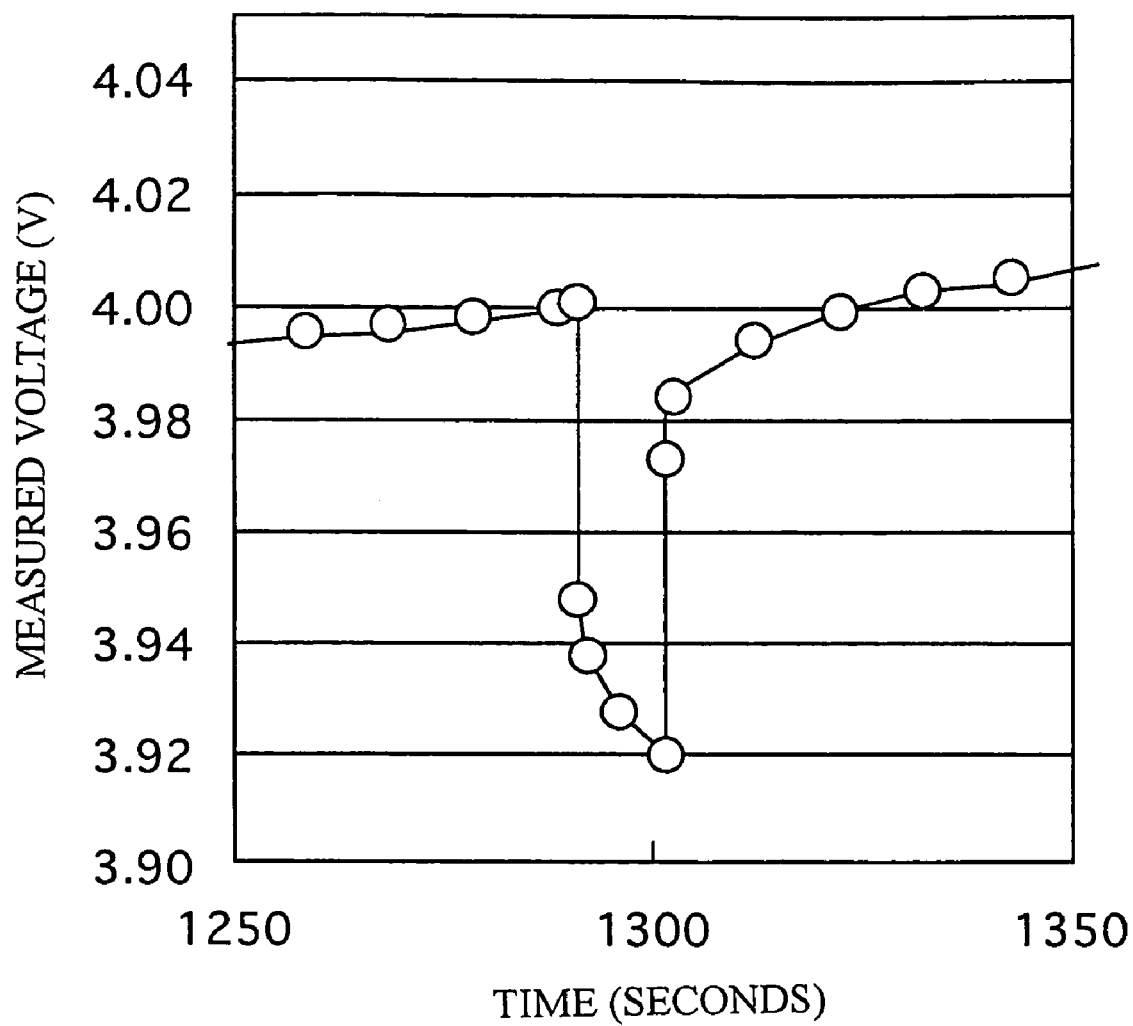
FIG. 26 is a graph for explaining the voltage drop when a 0.1 A pulse current is introduced at the time of charging.

It was confirmed that, when the battery being measured is charged, in the course of charging, with the pulse current of 0.1 A, the voltage drop shown in FIG. 26 was observed. A further detailed analysis of FIG. 26 reveals that the voltage drop is roughly divided into an area where voltage drop occurs instantaneously and an area where voltage drop occurs relatively moderately. If the area where voltage drop occurs instantaneously is an area related with the IR drop and the area where voltage drop occurs relatively moderately is an area related with the theory of Butler-Bolmer, it becomes possible to find the IR term in e.g. the equation (1).

The method for calculating the aforementioned capacity deterioration index S is now explained. The capacity deterioration index S may be found by carrying out pulse charging e.g. twice at the time of battery charging, measuring the charging capacity during the pulse space period and by comparing the so measured charging capacity to the charging capacity during the time defined between two voltages in a reference charging capacity, using the corrected voltage (measured voltage as corrected).

If, as indicated in FIG. 7 by the charging curve and the discharge curve, made to coincide with each other by the correction, the reference charging curve is an inversion of the reference discharge curve with respect to the capacity, the reference charging curve may be deemed to be the same as the reference discharge curve. That is, the charging capacity between a first corrected voltage $Va2$, corrected from a given first measured voltage $Va1$, and a second corrected voltage $Vb2$, corrected from a given second measured voltage $Vb1$, is measured and calculated. Moreover, the charging capacity of the reference charging curve between the first measured voltage $Va1$ and the second measured voltage $Vb1$ is found by calculations. If the voltage-corrected charging function is expressed as $g(V)$ and the function of the reference charging curve is expressed as $h(V)$, the capacity deterioration index S is determined by the following equation (15), $$S=[g(Va2)-g(Vb2)]/[h(Va2)-h(Vb2)] \quad (15)$$

where $g(Va2)-g(Vb2)$ may be found by measuring the capacity between the pulses by a current integrating method. On the other hand, $h(Va2)-h(Vb2)$ may readily be found by calculations using the reference charging curve as found at the outset. Thus, the capacity deterioration index S may be determined by an extremely simple method.

It is noted that, the smaller the capacity deterioration index S, as found by the above method, the more the battery is deteriorated. The state of battery deterioration may be diagnosed using this capacity deterioration index S as a measure of deterioration.

In the foregoing, the method for finding the capacity deterioration index S by measuring the voltage across two points has been explained. The present invention is, however, not limited to this embodiment. For example, the capacity deterioration index S may be found by using not two but e.g. ten points for voltage measurement, measuring the charging capacity at the voltages across these points, finding a second charging capacity from a curve of the reference charging capacity, with the use of the correction voltage, obtained on correcting the measured voltages, taking a ratio of these charging capacities and carrying out statistic calculation processing, such as averaging, for calculating the capacity deterioration index S. Of course, the number of the voltage measurement points is not limited to two or ten, and may be arbitrarily set, in which case the capacity calculation may be improved in accuracy with an increasing number of the measuring points.

The capacity calculation accuracy may be improved by increasing the width of the voltage for measurement for thereby increasing changes in the capacity.

In actuality, the internal resistance R and the capacity deterioration index S were measured of batteries 1 to 3 exhibiting respective different states of deterioration. Meanwhile, the degree of deterioration becomes severer in the sequence of the battery 1, battery 2 and the battery 3. Specifically, the batteries 1 to 3 were charged with pulses twice during the charging, with the charging current of 0.1 A, and the current internal resistance R and the capacity deterioration index S were measured from the voltage drop area. These results are shown in the following Table 2. The capacity deterioration index S, empirically found from the discharge curve, is also shown in Table 2.

TABLE 2

| | measured voltage 1 (V) | measured voltage 2 (V) | internal resistance R(Ω) | corrected voltage 1 (V) | corrected voltage 2 (V) | deterioration index S | deterioration index S as found from discharging capacity |
|---|---|---|---|---|---|---|---|
| battery (1) | 3.646 | 4.098 | 0.136 | 3.462 | 3.999 | 0.982 | 0.91 |
| battery (2) | 3.193 | 3.652 | 0.3 | 2.988 | 3.452 | 0.921 | 0.91 |
| battery (3) | 3.47 | 4.023 | 0.36 | 3.264 | 3.902 | 0.893 | 0.91 |

It is seen from Table 2 that the more the degree of battery deterioration proceeds, the larger becomes the internal resistance R and the smaller becomes the capacity deterioration index S. Thus, theoretically congruent results have been obtained with the present measurement. Comparison of the capacity deterioration index S, as found from the equation (15), to the deterioration index S, experimentally found from the discharge curve, indicates coincidence of the two within 3%, thus indicating that the present method is valid as a method for diagnosing the state of battery deterioration to an extremely high accuracy.

A battery 4, showing the degree of deterioration higher than that of the batteries 1 to 3, was provided, and pulse-charged twice during charging with the discharge current of 0.1 A, and the current internal resistance R and the capacity deterioration index S were found from the voltage drop area. These results are shown in the following Table 3. The capacity deterioration index S, as found empirically from the discharge curve, is also shown in the Table 3.

TABLE 3

| | measured voltage 1 (V) | measured voltage 2 (V) | internal resistance R(Ω) | corrected voltage 1 (V) | corrected voltage 2 (V) | deterioration index S | deterioration index S as found from discharging capacity |
|---|---|---|---|---|---|---|---|
| battery (4) | 3.501 | 3.053 | 0.31 | 3.701 | 3.233 | 0.915 | 0.907 |

Referring to Table 3, comparison of the capacity deterioration index S, as found from the equation (15), to the deterioration index experimentally found from the discharge curve, indicates coincidence of the two within 3%, thus indicating that the present method is valid as a method for diagnosing the state of battery deterioration to an extremely high accuracy.

Figure 27:
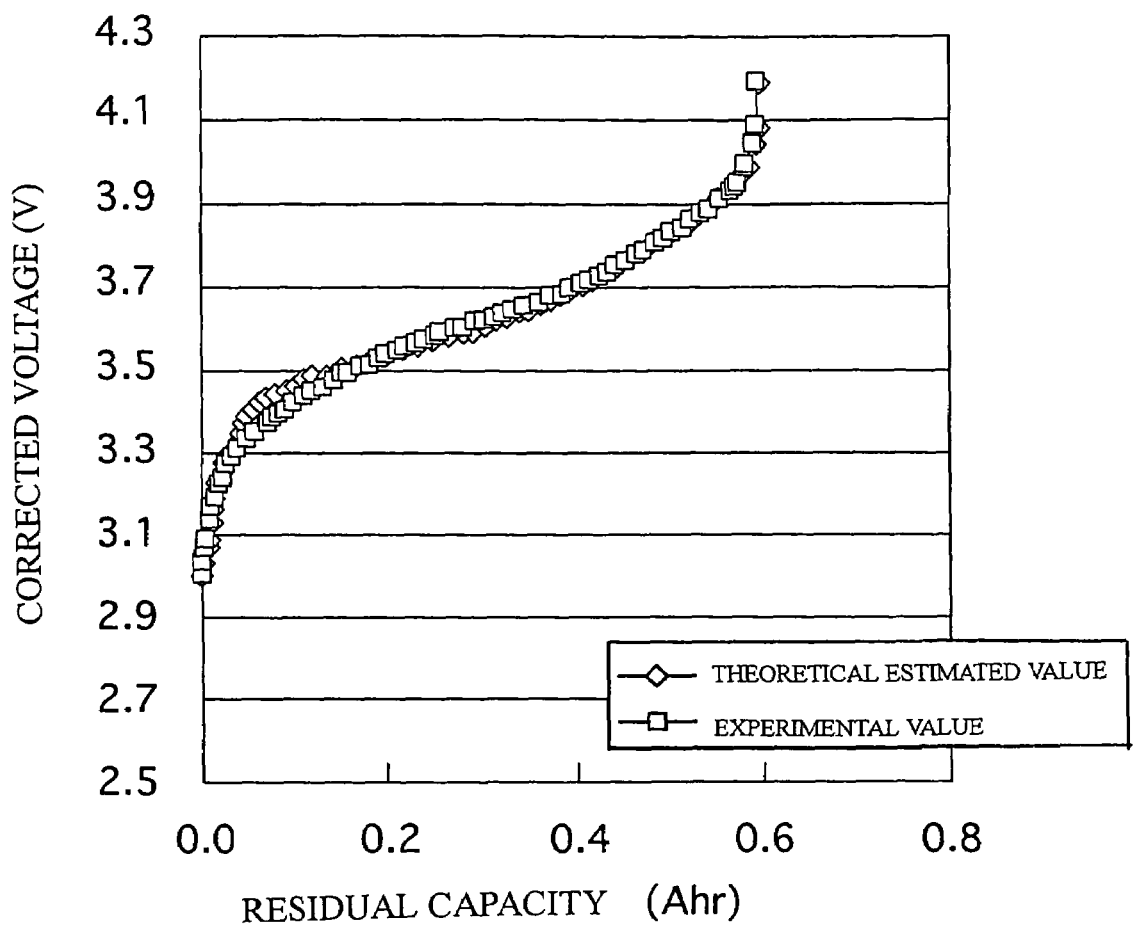
FIG. 27 is a graph showing a discharge curve following the correction and a reference discharge curve of a polymer battery.

The present invention may be applied without dependency on the battery type. This was actually confirmed, using a polymer battery with a nominal capacity of 0.7 Ah. FIG. 27 shows a discharge curve, obtained from a discharge curve, obtained on discharging a polymer battery at the 200th cycle at 20° C. at the discharge current of 0.6 A, by correction using the aforementioned corrected voltage V and the capacity deterioration index S, along with the reference discharge curve of the polymer battery. From the high degree of coincidence of the as-corrected discharge curve and the reference discharge curve, as indicated in FIG. 27, it has been shown that, even with the battery with different plural component materials, such as the polymer battery, capacity calculations to a high accuracy is possible, with the present invention, in the same way as the lithium ion secondary battery, as explained in the above embodiment.

Figure 28:
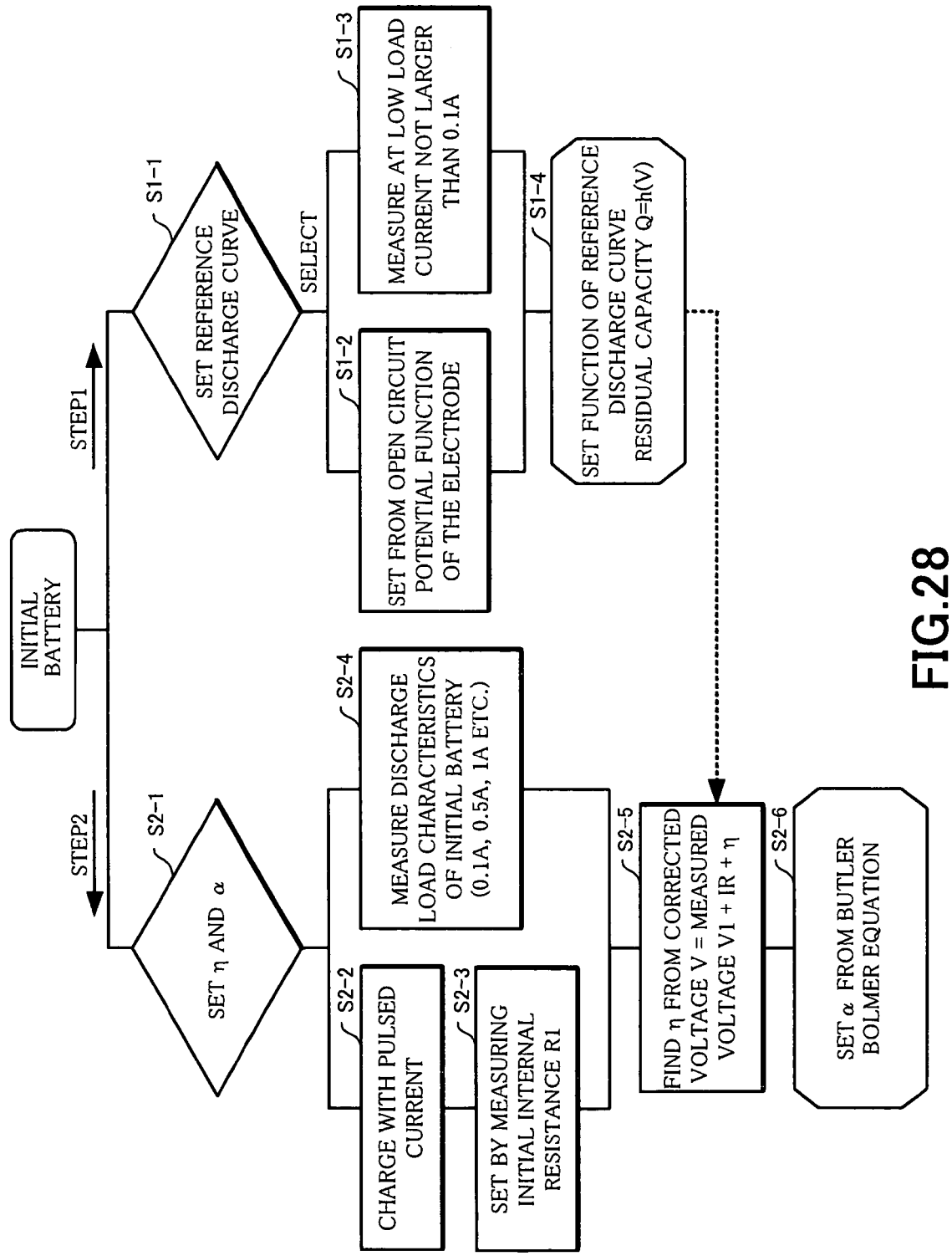
FIG. 28 depicts a typical flowchart for determining various parameters in an initial state battery as a subject of measurement.
Figure 29:
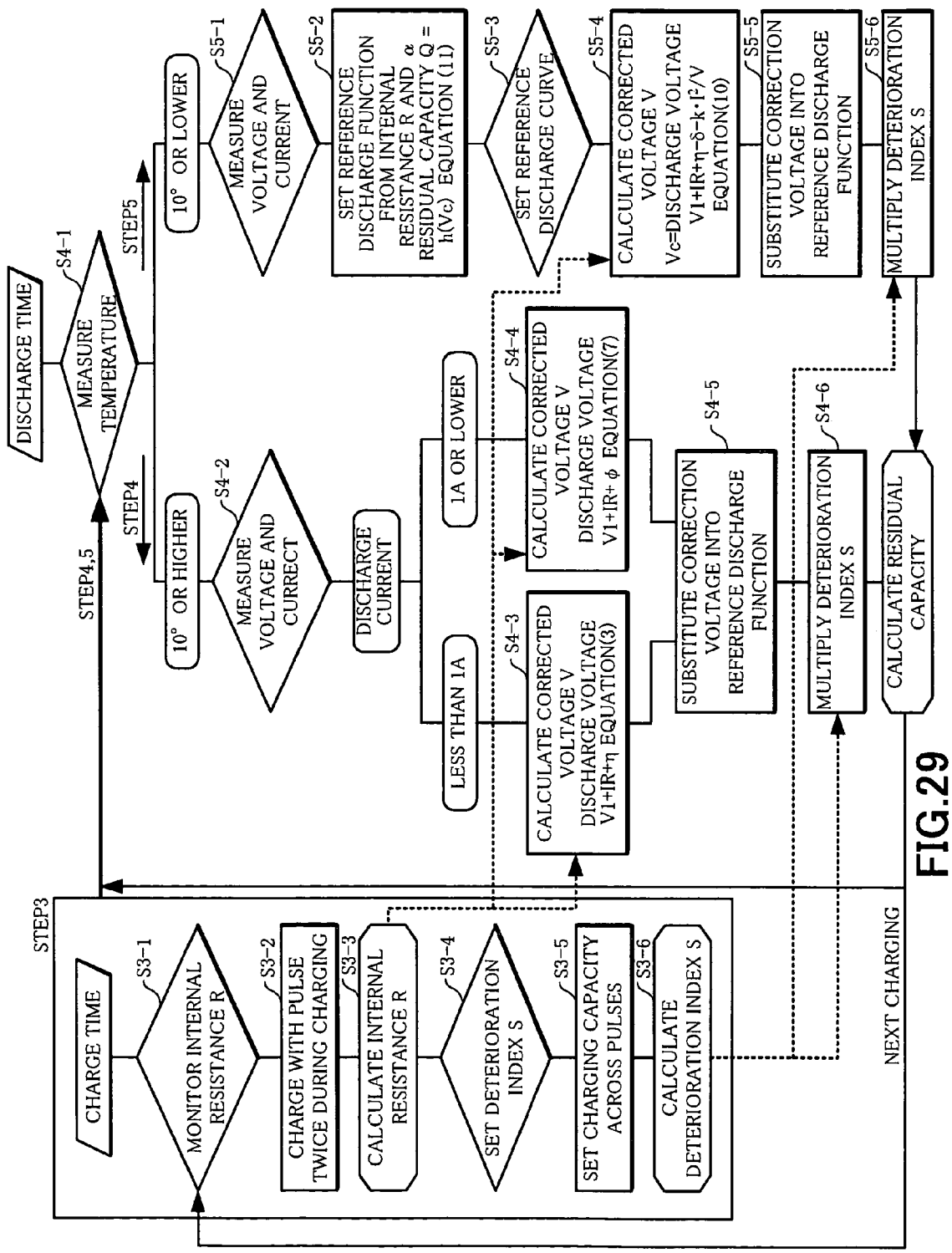
FIG. 29 depicts a typical control flowchart for calculating the residual battery of a battery as a subject of measurement.

A typical control sequence for calculating the residual capacity according to the present invention is now explained by referring to FIGS. 28 and 29. It is to be noted that the control sequence of the method for calculating the capacity according to the present invention is not limited to the typical control sequence as now explained and may also be combined with any suitable known method for calculating the residual capacity.

First, various parameters are found at the outset, for a battery of the initial state, by a process shown in FIG. 28.

In setting a reference discharge curve of the battery in the initial state, as in a step S1-1, it is selected whether a reference discharge curve, which is based on theoretical values, or a reference discharge curve, which is based on empirical values. In case the reference discharge curve, which is based on theoretical values, is to be used, an open circuit potential function of the cathode of the battery and an open circuit potential function of the anode of the battery are set in a step S1-2. In case the reference discharge curve, which is based on empirical values, is to be used, a discharge curve is actually measured, in a step S1-3, at a low load current, with the discharge current of 0.1 A or less. However, there are occasions where the discharge current of 0.1 A becomes a heavy load current for a battery with a small capacity or with a small electrode surface. It is therefore desirable to measure the discharge curve with 1 mA/cm$^2$ or less, preferably with 0.2 mA/cm$^2$ or less, in terms of the current density.

In a step S1-4, the reference discharge curve, as found in the step S1-2 or step S1-3, is expressed by a polynominal of an exponential function, shown for example in the equation (4), in order to set the function of the reference charging curve, represented by the residual capacity Q=h(V). There is no limitation to the type of the function, such as an exponential function or a trigonometric function, provided that the function selected is able to express the discharge curve. It is however desirable to select an optimum function type as the speed of calculations is taken into account.

In a step S2-1, the overvoltage η and the constant a in the Butler-Bolmer equation (2) of the battery in the initial state are determined.

First, in a step S2-2, the battery is charged with the pulse current. In the next step S2-3, the initial internal resistance R1 is found, on the basis of the voltage drop then induced.

In a step S2-4, discharge load characteristics of the battery in the initial state are measured for a variety of the values of the discharge current, such as 0.1 A, 0.5 A, 1 A and so forth, in order to find discharge curves.

In the next step S2-5, the overvoltage η is found from the equation (3), based on the initial internal resistance R1, as found in the step S2-3, the discharge curve, as found in the step S2-4, and on the reference discharge curve, as set in the step S1-4.

In the step S2-6, the overvoltage η as found by the Butler-Bolmer equation (2) and so forth are substituted to find the constant α.

The various parameters, determined as described above, are stored in optional storage means, such as a memory of a personal computer or a micro-computer, loaded on a battery pack, for use in subsequent process steps.

In the ensuing steps, shown in FIG. 29, as previously explained, the residual capacity of the built-in battery of an actual device is actually estimated, using the various values thus far found.

First, the control at the time of charging, shown in a step S3, is explained. In a step S3-1, the internal resistance R of the battery, not dependent on the current or the voltage, is measured. That is, in a step S3-2, the battery is charged with the pulse current. In a step S3-3, the internal resistance R is calculated, based on the voltage drop then induced. In a step S3-4, the capacity deterioration index S is set. That is, in a step S3-5, the capacity across two optional voltage points is measured by the current integrating method. The capacity across the two optional voltage points is also calculated from the reference discharge function as found at the outset in the step S1-4. In a step S3-6, the ratio between these capacity values is taken, using the equation (15), to calculate the capacity deterioration index S.

The above-described process of finding the internal resistance R and the capacity deterioration index S, shown in the step S3, may be carried out at the time of the discharging. It is however more desirable that this process shall be carried out during charging, because the process in this case has such merits that the current is constant and hence the capacity across the pulses may be measured accurately and that the processing of finding the internal resistance R and the capacity deterioration index S does not tend to affect the operation of the device. On the other hand, the battery need not be charged fully when finding the internal resistance R and the capacity deterioration index S at the time of charging.

In a step S4 or a step S5, the residual capacity of the battery is calculated. First, in a step S4-1, the ambient temperature of the battery is measured, during the discharge, in order to check whether or not the ambient temperature is not lower than say 10° C. If the ambient temperature is 10° C. or higher, the current and the voltage are measured in a step S4-2. Meanwhile, with the battery, as used in the test, the ambient temperature, at which to change over the correction methods, is most desirably set to approximately 10° C. However, since the ambient temperature, at which to change over the correction methods, is varied with the component materials of the active materials or the electrolytic solution, it may be set arbitrarily depending on the battery used or on battery characteristics.

If the discharge is low-load discharge, with the discharge current of e.g. 1 A or less, processing transfers to a step S4-3, where the corrected voltage V is calculated, using the overvoltage η as found at the outset in the step S2-6 and the internal resistance R as found at the outset in the step S3-3, in accordance with the equation (3). If it is determined in the step S4-2 that the discharge is heavy-load discharge, with the discharge current e.g. larger than 1 A, the voltage correction term ø is found in a step S4-4, in accordance with the equation (6), using the overvoltage η as found at the outset in the step S2-6 and the internal resistance R as found at the outset in the step S3-3, and the corrected voltage V is calculated, using the voltage correction term ø in accordance with the equation (7). Although it is stated in the foregoing that the equation (3) or the equation (7) is selected with the discharge current of 1 A as a reference, any suitable equation for correction may be used in dependence on the intensity of the discharge current and on the battery characteristics. While the method for finding the corrected voltage V is selected, with the discharge current of 1 A as a reference, the discharge current intensity is changed with the area of the electrode surface or the battery capacity. In the context of the present specification, the intensity of the discharge current of 1 A is approximately 2 mA/cm$^2$, in terms of current density.

In a step S4-5, the corrected voltage V, as obtained in the step S4-3 or in the step S4-4, is used, and substituted into the function of the reference discharge, as found in the step S1-4, to find the reference residual capacity.

In a step S4-6, the reference residual capacity thus obtained is multiplied with the capacity deterioration index S, as calculated in the step S3-6, to estimate the residual battery capacity at this time point to display the residual capacity by any suitable optional display means.

If it is found in the step S4-1 that the ambient temperature is less than 10° C., processing transfers to a step S5. That is, if the ambient temperature is less than 10° C., the current and the voltage are measured in a step S5-1. Then, in a step S5-2, the reference discharge function is set, using the internal resistance R and the constant α, as found in the step S2-6, in accordance with the equation (11). In a step S5-3, the reference discharge curve is set. Then, in a step S5-4, a voltage Vc, which is the corrected voltage V under a low temperature environment, is calculated, in accordance with the equation (8), using the internal resistance R as found at the outset in the step S3-3 and the voltage correction term δ as found from the equation (8). Then, in a step S5-5, the voltage Vc is substituted into the reference discharge curve to find the reference residual capacity. Then, in a step S5-6, the reference residual capacity, thus found out, is multiplied with the capacity deterioration index S, as calculated in the step S3-6, to estimate the residual capacity of the battery at the time point. The residual capacity is demonstrated by any suitable display means.

By the repetition of the above step S4 or S5, the residual capacity can be estimated accurately at any time point as necessary. However, if the charging is again made after estimating the residual capacity, the state of the battery deterioration is changed. Thus, processing reverts to the step S3-1 to update the internal resistance R and the capacity deterioration index S, after which processing reverts to the step S4 or S5 to estimate the residual capacity.

The present invention is not limited to the embodiments as herein explained with reference to the drawings. It should be understood by those skilled in the art that various changes, alternative constructions or equivalents can be implemented without departing from the scope of the invention as defined in the appended claims.

INDUSTRIAL APPLICABILITY

According to the battery capacity calculating method, according to the present invention, a reference discharge curve is found at the outset and at least a corrected voltage V is found. The residual capacity of the battery can then be estimated readily to a high accuracy by simply measuring the current discharging capacity.

The invention claimed is:

1. A method for measuring the capacity of a battery comprising:
   a step of calculating a reference discharge curve for finding a discharge curve operating as a reference;
   a correction voltage calculating step of correcting a measured voltage V1 of the battery by a resistance component of the battery to find a corrected voltage V; and
   a capacity calculating step of calculating the discharging capacity of the battery from said discharge curve, operating as reference, using said corrected voltage V, wherein, with a voltage derived from an internal resistance of the battery of V2, a current dependent resistance derived voltage of V3 and a voltage dependent resistance derived voltage of V4, said corrected voltage V is represented by the following equation:

$$\text{corrected voltage } V = V1 + \Sigma Vn$$

where $n \geq 2$, and $V2 \leq 0$, $V3 \leq 0$ and $V4 \leq 0$ if measurement is made during charging, while $V2 \geq 0$, $V3 \geq 0$ and $V4 \geq 0$ if measurement is made during discharging.

2. The method for measuring the battery capacity according to claim 1 wherein the voltage derived from an internal resistance of the battery V2 is equivalent to a voltage drop IR as found from a load current I and the internal resistance R of the battery.

3. The method for measuring the battery capacity according to claim 1 wherein the current dependent resistance derived voltage of V3 may be obtained on the basis of the Butler-Bolmer theory and/or the Nernst's marginal diffusion theory.

4. The method for measuring the battery capacity according to claim 1 wherein the voltage dependent resistance derived voltage V4 is found on the basis of the resistance against ion drift ascribable to the gradient of an electrical field in an electrolytic solution.

5. A method for measuring the capacity of a battery comprising:
   a step of calculating a reference discharge curve for finding a discharge curve operating as a reference;
   a correction voltage calculating step of correcting a measured voltage V1 of the battery by a resistance component of the battery to find a corrected voltage V; and
   a capacity calculating step of calculating the discharging capacity of the battery from said discharge curve, operating as reference, using said corrected voltage V;
   wherein said capacity calculating step includes a sub-step of calculating a capacity deterioration index S representing the ratio of capacity decrease due to deterioration of said battery;
   wherein said capacity calculating step calculating the discharging capacity by multiplying the discharging capacity, calculated from said discharge curve, operating as reference, with the use of said corrected voltage V, with said capacity deterioration index S; and
   wherein the charging capacity across two or more voltage points is measured to find a first charging capacity, a voltage derived from an internal resistance of the battery V2, as measured during charging based on the voltage drop in case of performing pulse charging at the time of charging, is found, a second charging capacity is found by calculating the charging capacity from a charging curve derived from said discharge curve, operating as a reference, using a corrected voltage V across two or more voltage points, as corrected by the voltage derived from the internal resistance of the battery V2, and wherein the ratio of said first and second charging capacities is taken to calculate said capacity deterioration index S.

6. A method for measuring the capacity of a battery comprising:
   a step of calculating a reference discharge curve for finding a discharge curve operating as a reference;
   a correction voltage calculating step of correcting a measured voltage V1 of the battery by a resistance component of the battery to find a corrected voltage V; and
   a capacity calculating step of calculating the discharging capacity of the battery from said discharge curve, operating as reference, using said corrected voltage V;
   wherein said capacity calculating step includes a sub-step of calculating a capacity deterioration index S representing the ratio of capacity decrease due to deterioration of said battery;
   wherein said capacity calculating step calculating the discharging capacity by multiplying the discharging capacity, calculated from said discharge curve, operating as reference, with the use of said corrected voltage V, with said capacity deterioration index S; and
   wherein the discharging capacity across two or more voltage points is measured to find a first discharging capacity, a voltage derived from an internal resistance of the battery V2, as measured during discharging based on the voltage drop in case of performing pulse discharging at the time of discharging, is found, a second discharging capacity is found by calculating the discharging capacity from said discharge curve, operating as a reference, using a corrected voltage V across two or more voltage points, as corrected by a voltage derived from the internal resistance of the battery V2, and wherein the ratio of said first and second discharging capacities is taken to calculate said capacity deterioration index S.

* * * * *